(12) United States Patent
Seo et al.

(10) Patent No.: US 11,706,949 B2
(45) Date of Patent: Jul. 18, 2023

(54) DISPLAY DEVICE AND METHOD OF MANUFACTURING THE SAME

(71) Applicant: Samsung Display Co., LTD., Yongin-si (KR)

(72) Inventors: Jong Oh Seo, Seoul (KR); Byung Soo So, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 133 days.

(21) Appl. No.: 17/192,424

(22) Filed: Mar. 4, 2021

(65) Prior Publication Data

US 2021/0359057 A1 Nov. 18, 2021

(30) Foreign Application Priority Data

May 15, 2020 (KR) .................... 10-2020-0058325

(51) Int. Cl.
*H01L 27/32* (2006.01)
*H10K 59/121* (2023.01)
(Continued)

(52) U.S. Cl.
CPC ....... *H10K 59/1213* (2023.02); *H10K 59/131* (2023.02); *H10K 71/00* (2023.02);
(Continued)

(58) Field of Classification Search
CPC . H01L 27/3262; H01L 27/3276; H01L 51/56; H01L 27/1222; H01L 27/1274;
(Continued)

(56) References Cited

U.S. PATENT DOCUMENTS 6,534,788 B1* 3/2003 Yeo .................... H01L 29/78648
257/66
2003/0015703 A1* 1/2003 Yamazaki ......... H01L 29/78636
257/E29.283
(Continued)

FOREIGN PATENT DOCUMENTS

KR 10-2017-0034318 3/2017
KR 10-2018-0026602 3/2018
KR 10-2019-0100554 8/2019

OTHER PUBLICATIONS

C. H. Kim et al., "A New High-Performance Poly-Si TFT by Simple Excimer Laser Annealing on Selectively Floating a-Si Layer",International Electron Devices Meeting, Dec. 2-5, 2001, pp. 34.3.1-34.3.4.

*Primary Examiner* — Dzung Tran
(74) *Attorney, Agent, or Firm* — Kile Park Reed & Houtteman PLLC

(57) ABSTRACT

A display device and a method of manufacturing a display device are provided. A display device includes a lower conductive pattern disposed on a substrate, a lower insulating layer disposed on the lower conductive pattern, the lower insulating layer including a first lower insulating pattern including an overlapping region overlapping the lower conductive pattern, and a protruding region. The display device includes a semiconductor pattern disposed on the first lower insulating pattern and having a side surface, the side surface being aligned with a side surface of the first lower insulating pattern or disposed inward from the side surface of the first lower insulating pattern, a gate insulating layer disposed on the semiconductor pattern, a gate electrode disposed on the gate insulating layer, and an empty space disposed between the substrate and the protruding region of the first lower insulating pattern.

14 Claims, 20 Drawing Sheets

(51) Int. Cl.
  H10K 59/131  (2023.01)
  H10K 71/00   (2023.01)
  G09G 3/3266      (2016.01)
  G09G 3/3275      (2016.01)
  G09G 3/3225      (2016.01)
  H01L 29/66       (2006.01)
  H01L 27/12       (2006.01)
  H01L 29/786      (2006.01)
  H10K 59/12       (2023.01)

(52) U.S. Cl.
  CPC ......... *G09G 3/3225* (2013.01); *G09G 3/3266* (2013.01); *G09G 3/3275* (2013.01); *G09G 2300/0426* (2013.01); *H01L 27/1222* (2013.01); *H01L 27/1274* (2013.01); *H01L 29/66757* (2013.01); *H01L 29/78615* (2013.01); *H01L 29/78675* (2013.01); *H10K 59/1201* (2023.02)

(58) Field of Classification Search
  CPC ......... H01L 29/66757; H01L 29/78615; H01L 29/78675; H01L 2227/323
  USPC .......................................................... 257/40
  See application file for complete search history.

(56) References Cited

U.S. PATENT DOCUMENTS

| | | | |
|---|---|---|---|
| 2011/0284852 A1* | 11/2011 | Kim ................. | H01L 29/78648 438/157 |
| 2015/0179810 A1* | 6/2015 | Yamazaki ........... | H01L 29/7869 257/43 |
| 2018/0069069 A1* | 3/2018 | Ebisuno ............. | H01L 27/3265 |
| 2019/0252479 A1* | 8/2019 | Kang ................. | H01L 27/3262 |

* cited by examiner

120: 121, 123

120_1: 121, 123

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0058325 under 35 U.S.C. § 119, filed in the Korean Intellectual Property Office on May 15, 2020, the entire contents of which are incorporated herein by reference.

BACKGROUND

1. Technical Field

The invention relates to a display device and a method of manufacturing the same.

2. Description of the Related Art

A display device for displaying an image may be used for various electronic appliances for providing an image to a user, such as smart phones, tablet PCs, digital cameras, notebook computers, navigators, and televisions. The display device may include pixels and a pixel circuit driving each pixel. Each pixel circuit may be constructed using a wiring formed on an insulating substrate and a thin film transistor.

The pixel circuit of the display device may include a thin film transistor using silicon. Amorphous silicon or polycrystalline silicon may be used as the silicon constituting the thin film transistor.

The amorphous silicon thin film transistor (a-Si TFT) that may be used in the pixel circuit may have a low electron mobility of about 1 $cm^2/Vs$ or less because a semiconductor active layer constituting a source, a drain and a channel may be made of amorphous silicon. Accordingly, in recent years, there has been a trend to replace the amorphous silicon thin film transistor with a polycrystalline silicon thin film transistor (polycrystalline silicon TFT: poly-Si TFT). The polycrystalline silicon thin film transistor may have a higher electron mobility and better stability against light irradiation than the amorphous silicon thin film transistor. Therefore, this polycrystalline silicon thin film transistor may be suitable for use as an active layer of a driving and/or switching thin film transistor of a display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the invention may be to provide a display device capable of realizing high resolution by highly integrating semiconductor elements for driving light while minimizing defects occurring in the process of crystallizing amorphous silicon into polycrystalline silicon and a method of manufacturing a display device.

However, aspects of the invention are not restricted to those expressly set forth herein. The above and other aspects of the invention will become more apparent to one of ordinary skill in the art to which the invention pertains by referencing the detailed description of the invention given below.

An embodiment of a display device may include a lower conductive pattern disposed on a substrate, a lower insulating layer disposed on the lower conductive pattern, the lower insulating layer including a first lower insulating pattern including an overlapping region overlapping the lower conductive pattern, and a protruding region. The display device may include a semiconductor pattern disposed on the first lower insulating pattern and having a side surface, the side surface being aligned with a side surface of the first lower insulating pattern or disposed inward from the side surface of the first lower insulating pattern, a gate insulating layer disposed on the semiconductor pattern, a gate electrode disposed on the gate insulating layer, and an empty space disposed between the substrate and the protruding region of the first lower insulating pattern.

The lower insulating layer may further include a second lower insulating pattern, a separation region may be disposed between the first lower insulating pattern and the second lower insulating pattern, and the first lower insulating pattern and the second lower insulating pattern may be at least partially separated by the separation region.

The separation region may expose at least a part of the empty space.

The gate insulating layer may be disposed in the separation region.

The second lower insulating pattern may not overlap the semiconductor pattern.

The first lower insulating pattern and the second lower insulating pattern may be completely separated, the first lower insulating pattern may have an island shape, and the second lower insulating pattern may surround the first lower insulating pattern.

At least a part of the side surface of the semiconductor pattern may protrude outward from the side surface of the lower conductive pattern.

The semiconductor pattern may include a channel region overlapping the gate electrode, and the channel region may overlap the lower conductive pattern.

The semiconductor pattern may include a first source or drain region and a second source or drain region disposed on a side and another side of the channel region, respectively, and the first source or drain region and the second source or drain region may overlap the empty space.

An upper portion of the empty space may be defined by a lower surface of the protruding region of the first lower insulating pattern, a side portion of the empty space may be defined by the side surface of the lower conductive pattern, and another side portion of the empty space may be defined by the gate insulating layer.

The display device may further include a barrier layer disposed between the substrate and the lower conductive pattern. A lower portion of the empty space may be defined by an upper surface of the barrier layer.

A height of the empty space may be equal to a thickness of the lower conductive pattern.

The display device may further include an upper insulating layer disposed on the gate electrode, and a signal line disposed on the upper insulating layer and electrically connected to the semiconductor pattern. The signal line may be one of a first power supply line and a data line.

The display device may further include a first source or drain electrode and a second source or drain electrode. The first source or drain electrode, the second source or drain electrode, and the signal line may be disposed on a same layer. The lower conductive pattern may be electrically connected to the gate electrode, or electrically connected to one of the first source or drain electrode and the second source or drain electrode.

An embodiment of a method of manufacturing a display device may include forming a lower conductive pattern on a substrate, forming a sacrificial layer on the substrate, the sacrificial layer having an upper surface as same as an extending surface of an upper surface of the lower conductive pattern, forming a lower insulating pattern on the lower conductive pattern and the sacrificial layer, the lower insulating pattern including an overlapping region overlapping the lower conductive pattern and a protruding region overlapping the sacrificial layer, forming a semiconductor pattern on the lower insulating pattern, removing the sacrificial layer to form an empty space between the substrate and the protruding region of the lower insulating pattern, and crystallizing the semiconductor pattern.

The removing of the sacrificial layer may include wet-etching the sacrificial layer, an etchant used in the wet etching may include hydrogen fluoride (HF), and the sacrificial layer may include titanium (Ti).

The semiconductor pattern may completely overlap the lower insulating pattern, and the lower insulating pattern may overlap the lower conductive pattern and the empty space.

A thickness of the lower conductive pattern may be equal to a height of the empty space.

At least a part of the side surface of the semiconductor pattern may protrude outward from the side surface of the lower conductive pattern.

An upper portion of the empty space may be defined by a lower surface of the protruding region of the first lower insulating pattern, a side portion of the empty space may be defined by the side surface of the lower conductive pattern, and another side portion of the empty space may be defined by the gate insulating layer.

There may be provided a display device capable of minimizing defects occurring in the process of crystallizing amorphous silicon into polycrystalline silicon and a method of manufacturing a display device.

The effects of the invention are not limited by the foregoing, and other various effects are anticipated herein.

BRIEF DESCRIPTION OF THE DRAWINGS

The above and other aspects and features of the invention will become more apparent by describing in detail embodiments thereof with reference to the attached drawings, in which.

DETAILED DESCRIPTION OF THE EMBODIMENTS

Figure 1:
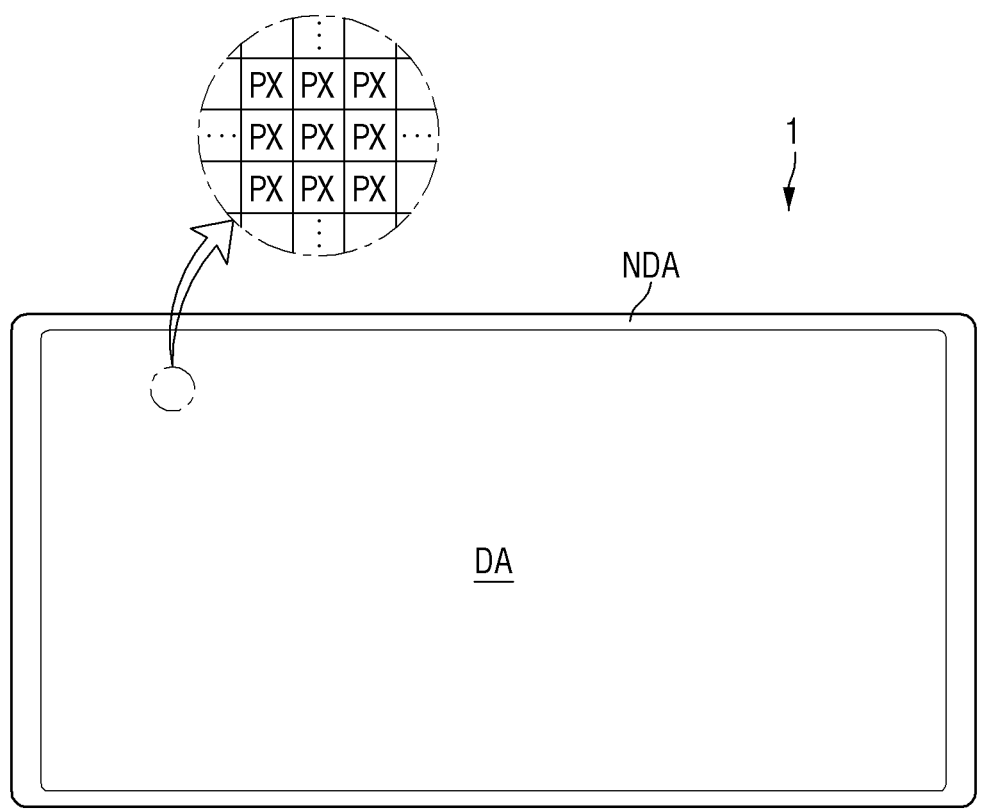
FIG. 1 is a schematic plan view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when a layer is referred to as being "on" another layer or substrate, it can be directly on another layer or substrate, or intervening layers may also be present. The same reference numbers indicate the same components throughout the specification. In the attached figures, the thickness of layers and regions may be exaggerated for clarity.

Use of the singular form (e.g., "a", "an", "the") may include plural forms as well, unless the context clearly indicates otherwise.

Terms such as "comprising", "including" and "having" are intended to indicate the existence of the elements disclosed in the disclosure, and are not intended to preclude the possibility that one or more other elements may exist or may be added.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

The phrase "at least one of" of is intended to include the meaning of "at least one selected from the group of" for the purpose of its meaning and interpretation. For example, "at least one of A and B" may be understood to mean "A, B, or A and B."

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Although an order may be described with respect to various processes (e.g., "first", "subsequent", and the like), the order may be modified and such modified embodiments are considered to be within the scope of the present disclosure.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the invention will be described with reference to the attached drawings.

Figure 2:
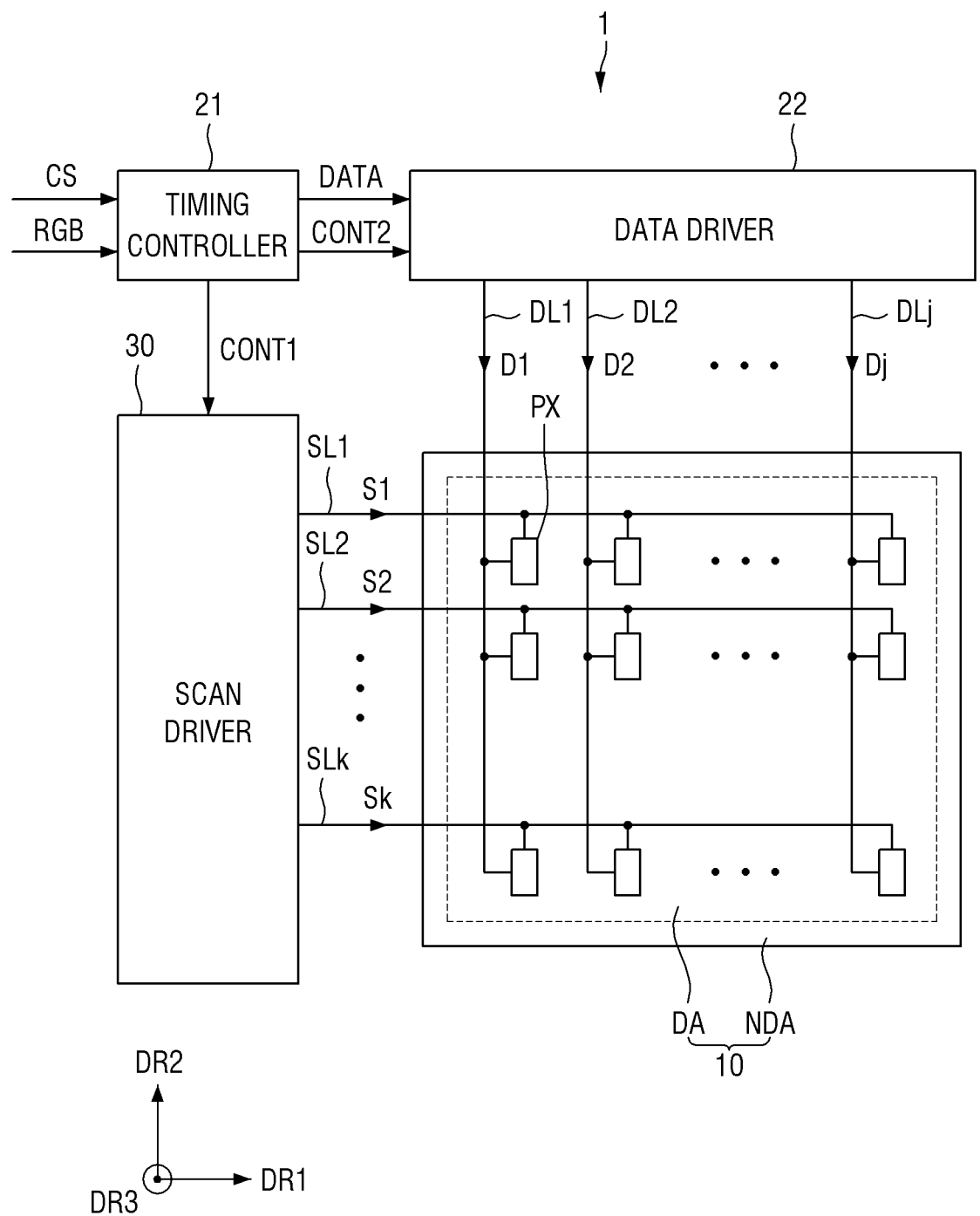
FIG. 2 is a schematic block diagram of a display device according to an embodiment.

FIG. 1 is a schematic plan view of a display device according to an embodiment, and FIG. 2 is a schematic block diagram of a display device according to an embodiment.

The display device 1, which may be a device for displaying a moving image or a still image, may be used as a display screen of various products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs).

The display device 1 according to an embodiment may be formed in a substantially rectangular shape on a plane. The display device 1 may have a rectangular shape with vertical corners on a plane. However, the invention is not limited thereto, and the display device 1 may have a rectangular shape with rounded corners on a plane.

In the drawings, the first direction DR1 indicates a horizontal direction of the display device 1 in a plan view, and the second direction DR2 indicates a vertical direction of the display device 1 in a plan view. The third direction DR3 indicates a thickness direction of the display device 1. The first direction DR1 and the second direction DR2 intersect each other in a direction perpendicular to each other, and the third direction DR3 intersects both the first direction DR1 and the second direction DR2 in a direction intersecting the plane in which the first direction DR1 and the second direction DR2 lie. However, the directions mentioned in embodiments should be understood as mentioning relative directions, and the embodiments are not limited to the mentioned directions.

Unless otherwise defined, as used herein, "upper portion", "upper surface", and "upper side" expressed based on the third direction DR3 mean a side of a display surface based on the display panel 10, and "lower portion", "lower surface", and "lower side" expressed based on the third direction DR3 mean an opposite side of a display surface based on the display panel 10.

The display device 1 according to an embodiment may include a display panel 10, a timing controller 21, a data driver 22, and a scan driver 30.

The display panel 10 may be an organic light emitting display panel. In the following embodiments, a case where an organic light emitting display panel may be applied as the display panel 10 is illustrated, but the invention is not limited thereto, and different kinds of display panels such as a liquid crystal display (LCD) panel, a quantum dot organic light emitting display (QD-OLED) panel, a quantum dot liquid crystal display (QD-LCD) panel, a quantum nano light emitting display panel (nano NED), and a micro light emitting diode (LED) may be applied.

The display panel 10 may include a display area DA in which an image may be displayed, and a non-display area NDA in which an image may not be displayed. The display panel 10 may be divided into a display area DA and a non-display area NDA in a plan view. The non-display area NDA may be disposed to surround the display area DA. The non-display area NDA may constitute a bezel.

The display area DA may have a rectangular shape with vertical corners or a rectangular shape with rounded corners. However, the planar shape of the display area DA is not limited to a rectangle, and may have a circular shape, an elliptical shape, or other various shapes.

The display area DA may include pixels PX. The pixels PX may be arranged in a matrix shape. Each pixel PX may include a light emitting layer and a circuit layer that may control the amount of light emitted from the light emitting layer. The circuit layer may include lines, electrodes, and at least one transistor. The light emitting layer may include an organic light emitting material. The light emitting layer may be sealed by an encapsulation layer. A detailed configuration of a pixel PX will be described later.

In the display area, not only pixels PX, but also scan lines SL1 to SLk (k may be an integer of 2 or more), data lines DL1 to DLj (j may be an integer of 2 or more), and power supply lines (not shown) may be arranged. The scan lines SL may extend in the first direction DR1, and may be arranged along the second direction DR2. The data lines DL may extend in the second direction DR2, and may be arranged along the first direction DR1.

The display panel 10 may include pixels PX that may be located at intersections of the scan lines SL1 to SLk and the data lines DL1 to DLj and may be arranged in a matrix form. Each of the pixels PX may be electrically connected to at least one of the scan lines SL and at least one of the data lines DL.

The timing controller 21 may receive digital video data DATA and timing signals from a host system. The timing controller 21 may generate control signals CS for controlling the operation timings of the data driver 22 and the scan driver 30. The control signals CS may include a source control signal CONT2 for controlling the operation timing of the data driver 22 and a scan control signal CONT1 for controlling the operation timing of the scan driver 30.

The scan driver 30 generates scan signals S1 to Sk (k may be an integer of 2 or more) according to the scan control signal CONT1 and supplies the scan signals S1 to Sk to the scan lines SL1 to SLk of the display panel 10.

The data driver 22 converts the digital video data DATA into data voltages (e.g., analog data voltages) according to the source control signal CONT2 and supplies the data voltages (e.g., analog data voltages) to the data lines DL1 to DLj of the display panel 10.

A power supply circuit (not shown) may generate voltages required for driving the display panel 10 from a main power applied from a system board and supply the voltages to the display panel 10.

Figure 3:
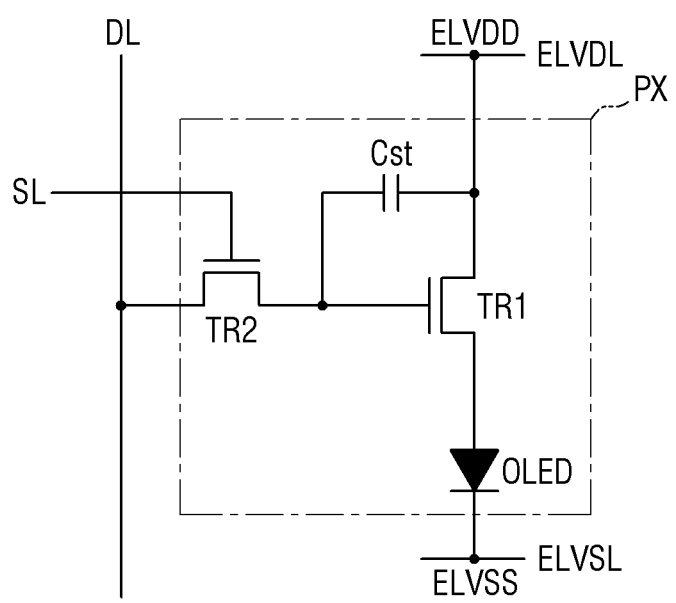
FIG. 3 is a schematic diagram of an equivalent circuit of one pixel of a display device according to an embodiment.

FIG. 3 is a schematic diagram of an equivalent circuit of one pixel of a display device according to an embodiment.

Referring to FIG. 3, the pixel PX may include a first transistor TR1, a second transistor TR2, a light emitting element OLED, and a capacitor Cst. Although it is shown in FIG. 3 that each pixel PX has a 2T1C structure of two transistors TR1 and TR2 and one capacitor Cst, the invention is not limited thereto. Each pixel PX may include transistors and capacitors. For example, each pixel PX may have various structures such as 3T1C, 6T1C, and 7T1C.

Each of the first and second transistors TR1 and TR2 may include a first source/drain electrode, a second source/drain electrode, and a gate electrode. One of the first source/drain electrode and the second source/drain electrode may be a source electrode, and another thereof may be a drain electrode.

Each of the transistors TR1 and TR2 may be a thin film transistor. Although it is shown in FIG. 3 that each of the transistors TR1 and TR2 may be an N-type metal oxide semiconductor field effect transistor (MOSFET), the invention is not limited thereto. Each of the transistors TR1 and TR2 may be a P-type MOSFET. The positions of the source and drain electrodes of each of the first transistor TR1 and the second transistor TR2 may be changed. Hereinafter, a case where each of the transistors TR1 and TR2 may be an N-type MOSFET will be described as an example.

The first transistor TR1 may be a driving transistor. Specifically, the gate electrode of the first transistor TR1 may be electrically connected to the second source/drain electrode of the second transistor TR2 and the second electrode (or first electrode) of the capacitor Cst. The first source/drain electrode of the first transistor TR1 may be electrically connected to a first power supply line ELVDL. The second source/drain electrode of the first transistor TR1 may be electrically connected to the anode electrode of the light emitting element OLED. The first transistor TR1 may receive a data signal Dj (j may be an integer of 1 or more) according to the switching operation of the second transistor TR2 and supply a driving current to the light emitting element OLED.

The second transistor TR2 may be a switching transistor. Specifically, the gate electrode of the second transistor TR2 may be electrically connected to the scan line SL. The first source/drain electrode of the second transistor TR2 may be electrically connected to the data line DL. The second source/drain electrode of the second transistor TR2 may be electrically connected to the gate electrode of the first transistor TR1 and the second electrode of the capacitor Cst. The second transistor TR2 may be turned on according to the scan signal Sk (k may be an integer of 1 or more) to perform a switching operation of transferring the data signal Dj (j may be an integer of 1 or more) to the gate electrode of the first transistor TR1.

The first electrode (or second electrode) of the capacitor Cst may be electrically connected to the first power supply line ELVDL and the first source/drain electrode of the first transistor TR1, and the second electrode of the capacitor Cst may be electrically connected to the gate electrode of the first transistor TR1 and the second source/drain electrode of the second transistor TR2. The capacitor Cst may serve to maintain a constant data voltage applied to the gate electrode of the first transistor TR1.

The light emitting element OLED may emit light according to the driving current of the first transistor TR1. The light emitting element OLED may be an organic light emitting diode including an anode electrode (or a first electrode), an organic light emitting layer, and a cathode electrode (or a second electrode). However, the invention is not limited thereto. The anode electrode of the light emitting element OLED may be electrically connected to the second source/drain electrode of the first transistor TR1, and the cathode electrode thereof may be electrically connected to a second power supply line ELVSL to which a second power voltage ELVSS lower than the first power voltage ELVDD may be applied.

Hereinafter, the planar arrangement and cross-sectional structure of the aforementioned pixel PX will be described in detail.

Figure 4:
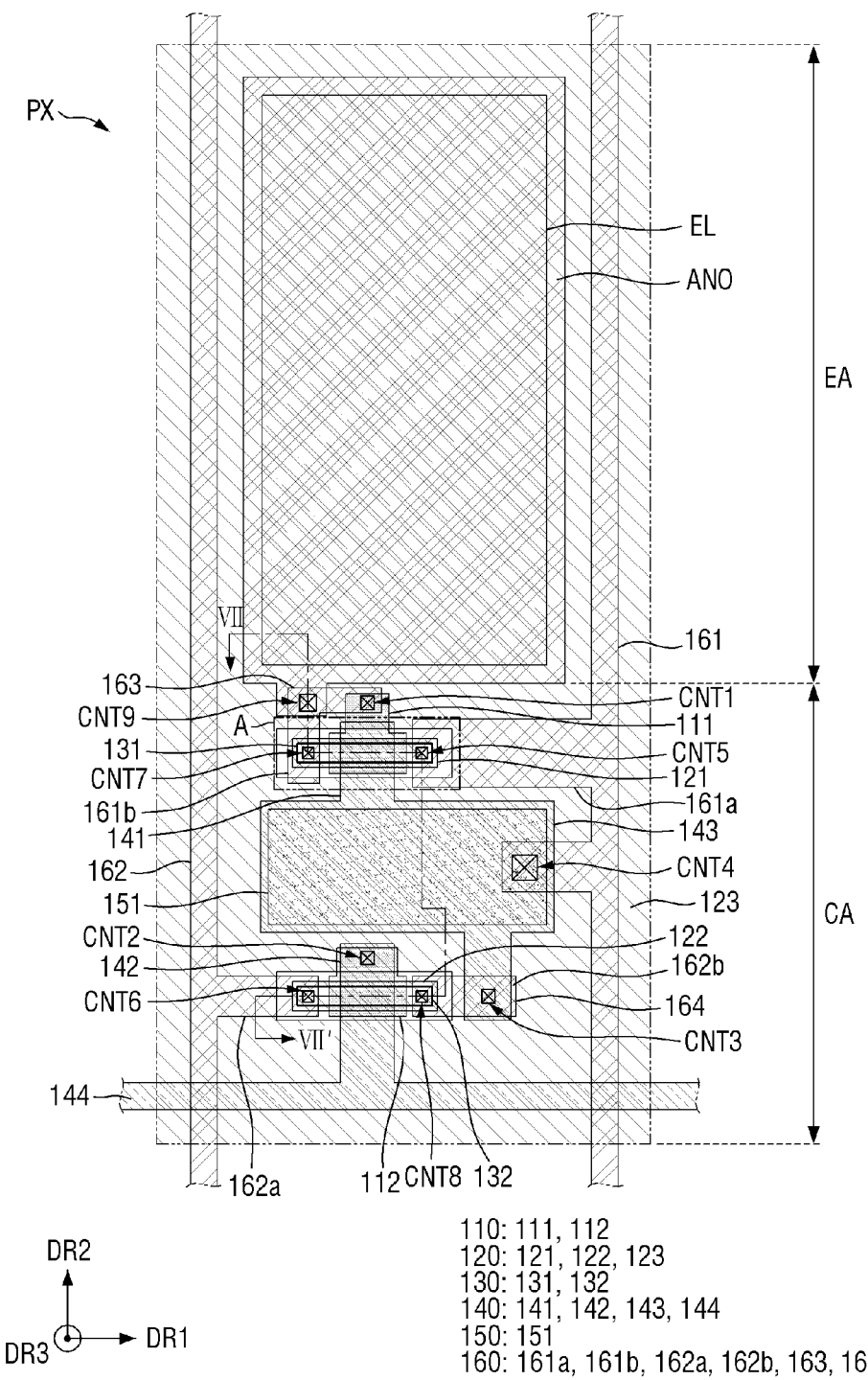
FIG. 4 is a schematic plan view of one pixel of a display device according to an embodiment.
Figure 5:
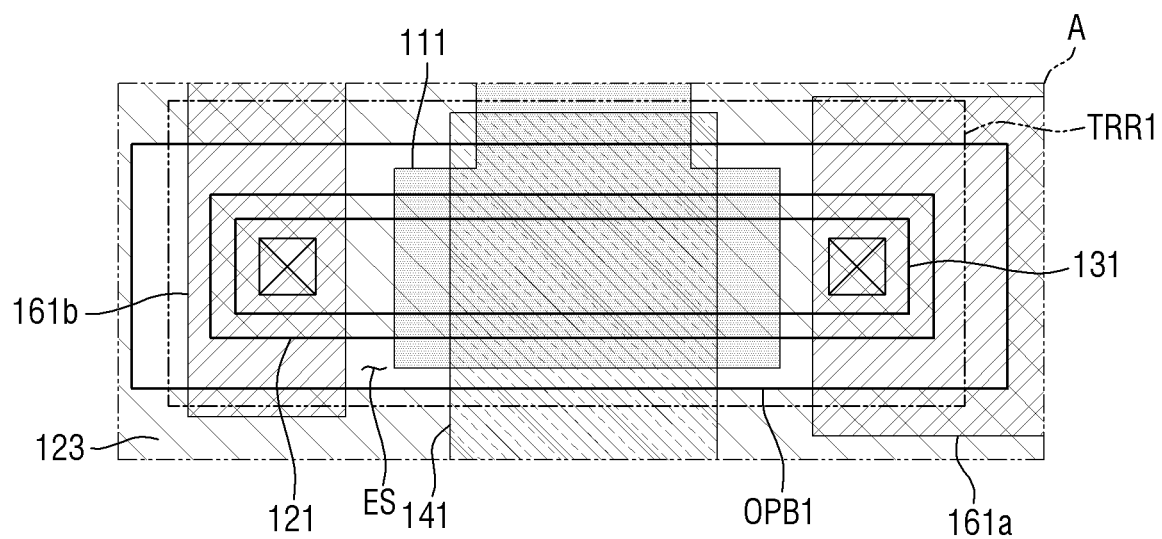
FIG. 5 is an enlarged schematic view of area A in FIG. 4.
Figure 6:
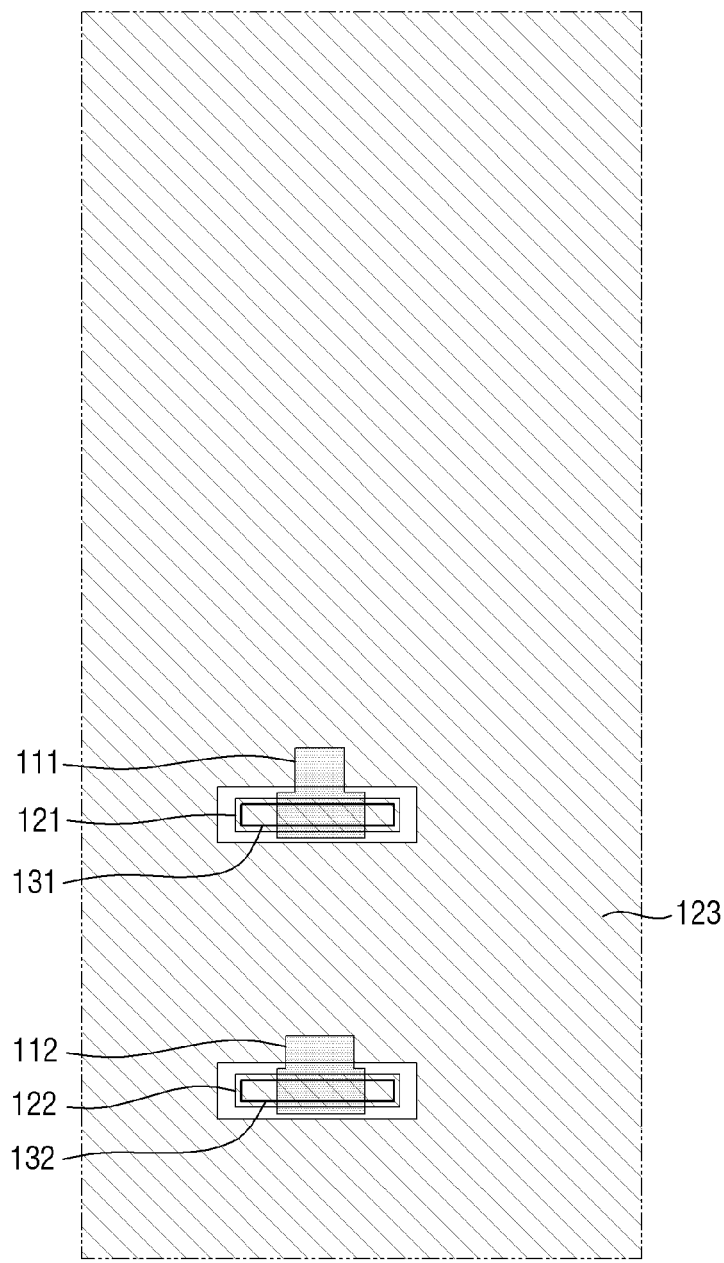
FIG. 6 is a schematic plan view of a first conductive layer, a lower insulating layer, and a semiconductor layer according to an embodiment.
Figure 7:
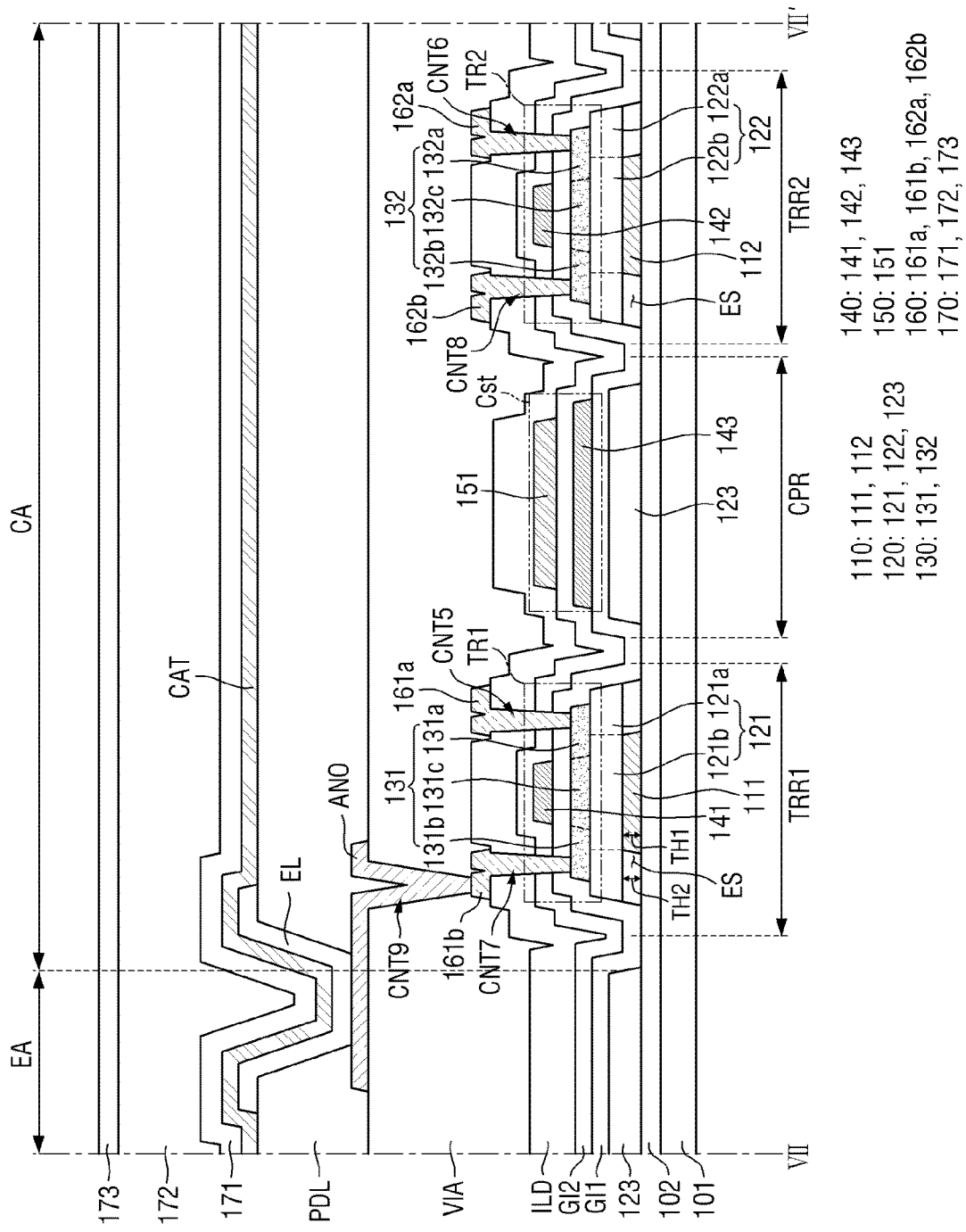
FIG. 7 is a schematic cross-sectional view taken along line VII-VII' in FIG. 4.

FIG. 4 is a schematic plan view of one pixel of a display device according to an embodiment, FIG. 5 is an enlarged schematic view of area A in FIG. 4, FIG. 6 is a schematic plan view of a first conductive layer, a lower insulating layer, and a semiconductor layer according to an embodiment, and FIG. 7 is a schematic cross-sectional view taken along line VII-VII' in FIG. 4.

Referring to FIGS. 4 to 7, one pixel PX may include a light emitting area EA and a circuit area CA. The light emitting area EA may be an area where the light emitting element OLED may be disposed to emit light. The circuit area CA may be an area where a first transistor TR1, a second transistor TR2, and a capacitor Cst, which may be electrically connected to the data line DL and the scan line SL, may be provided, and the light emitting element OLED may be driven.

Each of the transistors TR1 and TR2 may include a conductive layer forming an electrode, a semiconductor pattern forming a channel, and an insulating layer. The capacitor Cst may include conductive layers forming electrodes and an insulating layer disposed between the conductive layers. Specifically, the capacitor Cst may include a first electrode 151 (or an upper electrode), a second electrode 143 (or a lower electrode), and an insulating layer disposed therebetween. The above-described conductive material, conductive layer, semiconductor layer, and insulating layer may be disposed on a base substrate 101.

The display panel 10 according to an embodiment may include a semiconductor layer 130, conductive layers, and insulating layers, which may be disposed on the base substrate 101. The conductive layers may include a first conductive layer 110, a second conductive layer 140, a third conductive layer 150, a fourth conductive layer 160, and an anode electrode ANO. The insulating layers may include a lower insulating layer 120 (or a buffer layer), a first gate insulating layer GI1, a second gate insulating layer GI2, an interlayer insulating layer ILD, and a via layer VIA. The respective layers of the display panel 10 may be arranged on the base substrate 101 in order of a barrier layer 102, a first conductive layer 110, a lower insulating layer 120, a semiconductor layer 130, a first gate insulating layer GI1, a second conductive layer 140, a second gate insulating layer GI2, a third conductive layer 150, an interlayer insulating layer ILD, a fourth conductive layer 160, a via layer VIA, an anode electrode ANO, and a pixel defining layer PDL. Each of the above-described layers may be formed as a single film, but may also be formed as a laminated film including multiple films. Another layer may be further disposed between the respective layers.

The base substrate 101 may support each layer disposed thereon. The base substrate 101 may be made of an insulating material such as a polymer resin. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. The base substrate 101 may include a metal material.

The base substrate 101 may be a flexible substrate capable of bending, folding, rolling, or the like. Examples of the material constituting the flexible substrate include, but are not limited to, polyimide (PI).

In case that the organic light emitting display device may be a back emission type or double emission type display device, a transparent substrate may be used. In case that the organic light emitting display device may be a front emission type display device, not only a transparent substrate, but also a translucent or opaque substrate may be used.

The barrier layer 102 may be disposed on the base substrate 101. The barrier layer 102 may prevent the diffusion of impurity ions, may prevent the penetration of moisture or external air, and may perform a surface planarization function. The barrier layer 102 may include at least one of silicon nitride, silicon oxide, and silicon oxynitride. The barrier layer 102 may be omitted depending on the type of base substrate 101 or process conditions.

The first conductive layer 110 may be disposed on the barrier layer 102. However, the invention is not limited thereto, and in case that the barrier layer 102 may be omitted, the first conductive layer 110 may be disposed on the base substrate 101. The first conductive layer 110 may include a first lower conductive pattern 111 and a second lower conductive pattern 112.

The first lower conductive pattern 111 may be disposed under a semiconductor pattern 131 of the first transistor TR1. The first lower conductive pattern 111 may overlap at least a channel region 131c of the semiconductor pattern 131 of the first transistor TR1 in the thickness direction (third direction DR3). At least a part of the first lower conductive pattern 111 completely overlaps the channel region 131c of the semiconductor pattern 131 of the first transistor TR1, but the first lower conductive pattern 111 may not overlap first and second source/drain regions 131a and 131b of the semiconductor pattern 131 of the first transistor TR1 in the thickness direction (third direction DR3) or may partially overlap the first and second source/drain regions 131a and 131b of the semiconductor pattern 131, but the invention is not limited thereto.

The first lower conductive pattern 111 may be electrically connected to the first conductive pattern 163 of the fourth conductive layer 160 (or the second source/drain electrode 161b of the first transistor TR1) through a contact hole CNT1 penetrating the interlayer insulating layer ILD, the second gate insulating layer GI2, the first gate insulating layer GI1, and the lower insulating layer 120. As the first lower conductive pattern 111 may be disposed under the semiconductor pattern 131 of the first transistor TR1, the first transistor TR1 may be easily operated as a driving transistor, and the deterioration in electrical characteristics of the semiconductor pattern 131 of the first transistor TR1 may be prevented.

Specifically, in case that the first transistor TR1 may be turned off, a positive back-bias voltage may be applied to the first transistor TR1 from the first lower conductive pattern 111, and the amount of trap charges in the channel region 131c may be reduced. For example, a depletion region may be more easily formed in the channel region 131c of the semiconductor pattern 131 of the first transistor TR1. Accordingly, in the display device 1, an afterimage, a hysteresis issue, and a flicker phenomenon may be suppressed or prevented. Light incident from the lower portion of the base substrate 101 may be prevented from reaching the semiconductor pattern 131 of the first transistor TR1, thereby minimizing a variation in threshold voltage of the first transistor TR1.

The second lower conductive pattern 112 may be disposed under a semiconductor pattern 132 of the second transistor TR2. The second lower conductive pattern 112 may overlap at least a channel region 132c of the semiconductor pattern 132 of the second transistor TR2. The second lower conductive pattern 112 may be electrically connected to the gate electrode 142 of the second transistor TR2 through a contact hole CNT2 penetrating the interlayer insulating layer ILD and the second gate insulating layer GI2. As the second lower conductive pattern 112 may be disposed under the semiconductor pattern 132 of the second transistor TR2, the second transistor TR2 may be controlled by the two gate electrodes 142 and 112, and thus the second transistor TR2 may be operated more easily as a switching transistor.

The first conductive layer may include molybdenum (Mo). However, the material thereof is not limited thereto.

The lower insulating layer 120 may be disposed on the first conductive layer 110. The lower insulating layer 120 may cover the first conductive layer 110 in the display area DA and the non-display area NDA, and may be entirely disposed on the barrier layer 102 exposed by the first conductive layer 110. The lower insulating layer 120 may serve as an interlayer insulating layer that insulates the first conductive layer 110 and the semiconductor layer 130.

The lower insulating layer 120 may include a first lower insulating pattern 121, a second lower insulating pattern 122, and a third lower insulating pattern 123. The first lower insulating pattern 121, the second lower insulating pattern 122, and the third lower insulating pattern 123 may be disposed to be at least partially separated from each other. The lower insulating layer 120 may expose at least a part of a space (ES, empty space) in the separation region. A separate insulating layer or the like may be disposed in the separation region. In an embodiment, although it may be described that the first lower insulating pattern 121, the second lower insulating pattern 122, and the third lower insulating pattern 123 may be completely separated, the invention is not limited thereto.

The first lower insulating pattern 121 may overlap the semiconductor pattern 131 of the overlying first transistor TR1 in the thickness direction (third direction DR3), and the second lower insulating pattern 122 may overlap the semiconductor pattern 132 of the overlying second transistor TR2 in the thickness direction (third direction DR3). The third lower insulating pattern 123 may be an area excluding the first lower insulating pattern 121 and the second lower insulating pattern 122 from the lower insulating layer 120. The third lower insulating pattern 123 may not overlap the semiconductor layer 130 in the thickness direction (third direction DR3), but the invention is not limited thereto.

The first lower insulating pattern 121 and the second lower insulating pattern 122 may be disposed for each pixel PX, and the third lower insulating pattern 123 may be disposed over multiple pixels PX. The third lower insulating pattern 123 may be disposed in most of the light emitting area EA and the circuit area CA of each pixel PX. The first lower insulating pattern 121 may be disposed in a first transistor region TRR1, and the second lower insulating pattern 122 may be disposed in a second transistor region TRR2. A part of the third lower insulating pattern 123 may be disposed in a capacitor region CPR, and may also be disposed in the remaining area of the pixel PX in which the first lower insulating pattern 121 and the second lower insulating pattern 122 may not be disposed. For example, the third lower insulating pattern 123 may occupy most of the lower insulating layer 120.

The lower insulating layer 120 may further include a first buffer opening OPB1 and a second buffer opening OPB2 defined by the third lower insulating pattern 123. The first buffer opening OPB1 and the second buffer opening OPB2 may be disposed in the circuit area CA, and may be disposed to be spaced apart from each other.

The first buffer opening OPB1 may be disposed to overlap the first lower insulating pattern 121, and the second buffer opening OPB2 may be disposed to overlap the second lower insulating pattern 122. For example, the first lower insulating pattern 121 and the second lower insulating pattern 122 may be formed in an island shape in a plan view. In a plan view, the first lower insulating pattern 121 and the second lower insulating pattern 122 may be separated from the third lower insulating pattern 123, but may be surrounded by the third lower insulating pattern 123. The first buffer opening OPB1 and the second buffer opening OPB2 may expose at least a part of the underlying barrier layer 102 and/or at least a part of the underlying first conductive layer 110 in an area where the first lower insulating pattern 121 and the second lower insulating pattern 122 may not be disposed, The first lower insulating pattern 121 and the second lower insulating pattern 122 may include overlapping regions 121b and 122b and protruding regions 121a and 122a, respectively. The overlapping region 121b of the first lower insulating pattern 121 may overlap the first lower conductive pattern 111 in the thickness direction (third direction DR3), and the protruding region 121a of the first lower insulating pattern 121 may extend outward from the overlapping region 121b. The protruding region 121a of the first lower insulating pattern 121 may protrude from the side surface of the first lower conductive pattern 111.

At least a part of the first lower insulating pattern 121 may be spaced apart from the underlying barrier layer 102 or the base substrate 101 in the thickness direction (third direction DR3). A space (ES, empty space) may be disposed between the first lower insulating pattern 121 and the underlying barrier layer 102 or the base substrate 101. Specifically, the first lower conductive pattern 111 may be disposed between the overlapping region 121b of the first lower insulating pattern 121 and the underlying barrier layer 102, and the space ES may be disposed between the protruding region 121a of the first lower insulating pattern 121 and the underlying barrier layer 102.

A separate configuration may not be disposed in the space ES. The space ES may be in a vacuum state or filled with a gas or the like. The gas may be, for example, inert gas or general atmosphere, but is not limited thereto. However, the invention is not limited thereto, and in the space, particles (or foreign matter) may be disposed on the barrier layer 102, beside the first lower conductive pattern 111, and/or under the first lower insulating pattern 121. The foreign material may include titanium (Ti), and may be a portion remaining after a sacrificial layer SFL (refer to FIG. 10), which will be described later, may be etched.

The space ES may be surrounded by the barrier layer 102, the first lower conductive pattern 111, the first lower insulating pattern 121, and the separate insulating layer (for example, the first gate insulating layer GI1). For example, the space ES may be defined by the barrier layer 102, the first lower conductive pattern 111, the first lower insulating pattern 121, and the separate insulating layer (for example, the first gate insulating layer GI1).

In other words, the upper surface of the barrier layer 102 may be located under the space ES, and the first lower insulating pattern 121 may be located over the space ES. The first lower conductive pattern 111 and the separate insulating layer (for example, the first gate insulating layer GI1) may be located on a side of the space ES and another side thereof facing the side thereof. For example, the bottom surface (lower surface) of the space ES may be defined by the upper surface of the barrier layer 102, the upper surface of the space ES may be defined by the first lower insulating pattern 121, and a side and another side of the space ES may be defined by a side surface of the first lower conductive pattern and the separate insulating layer (for example, the first gate insulating layer GI1).

The thickness (TH2, width in the third direction DR3) of the space ES may be substantially the same as the thickness (TH1, width in the third direction DR3) of the first lower conductive pattern 111, but the invention is not limited thereto. Further, the height of the space ES may be substantially the same as the thickness (TH1, width in the third direction DR3) of the first lower conductive pattern 111. For example, the upper surface of the first lower conductive pattern 111 and the upper surface of the space ES may be located at the same level and substantially on the same plane, or the upper surface of the space ES may be as same as an extending surface of the upper surface of the first lower conductive pattern 111.

As the upper surface of the space ES may be disposed on the extending surface of the upper surface of the first lower conductive pattern 111, the bottom surface (lower surface) of the first lower insulating pattern 121 may be substantially flat, and the upper surface of the first lower insulating pattern 121 may also be substantially flat. Further, the semiconductor pattern 131 of the first transistor TR1 disposed on the first lower insulating pattern 121 may also be substantially flat.

Accordingly, even in case that the first lower conductive pattern 111 overlapping a part of the semiconductor pattern 131 of the first transistor TR1 in the thickness direction (the third direction DR3) may be disposed, the protruding region 121a of the first lower insulating pattern 121 may be spaced apart from the barrier layer 102, thereby making the first lower insulating pattern 121 substantially flat without a step. Accordingly, the semiconductor pattern 131 of the first transistor TR1 disposed on the first lower insulating pattern 121 may be disposed over the entire area without a step. As will be described later, in case that the semiconductor pattern 131 of the first transistor TR1 may be disposed over the entire area without a step, the semiconductor pattern 131 may be crystallized more easily.

Although the first lower insulating pattern 121 has been described, this description may be applied to the second lower insulating pattern 122 in the same manner. Therefore, redundant description is omitted.

The lower insulating layer 120 may include at least one of silicon nitride, silicon oxide, and silicon oxynitride.

The semiconductor layer 130 may be disposed on the lower insulating layer 120. The semiconductor layer 130 may be disposed in the light emitting area EA and circuit area CA of one pixel PX. The semiconductor layer 130 may include a semiconductor pattern 131 of the first transistor TR1 (or a first semiconductor pattern) and a semiconductor pattern 132 of the second transistor TR2 (a second semiconductor pattern). The semiconductor pattern 131 of the first transistor TR1 may be an active layer of the first transistor TR1, and the semiconductor pattern 132 of the second transistor TR2 may be an active layer of the second transistor TR2.

The semiconductor pattern 131 of the first transistor TR1 and the semiconductor pattern 132 of the second transistor TR2 may be disposed for each pixel PX. The semiconductor pattern 131 of the first transistor TR1 may be disposed in the first transistor region TRR1, and the semiconductor pattern 132 of the second transistor TR2 may be disposed in the second transistor region TRR2. Although it is illustrated in the drawing that the semiconductor pattern 131 of the first transistor TR1 and the semiconductor pattern 132 of the second transistor TR2 extend in the first direction DR1, this is exemplary, and the shapes of the semiconductor pattern 131 of the first transistor TR1 and the semiconductor pattern 132 of the second transistor TR2 are not limited thereto.

The semiconductor pattern 131 of the first transistor TR1 may completely overlap the first lower insulating pattern 121 in the thickness direction (third direction DR3), and may be disposed on the first lower insulating pattern 121. For example, the semiconductor pattern 131 of the first transistor TR1 may overlap the first lower insulating pattern 121 in all regions in the thickness direction (third direction DR3), whereas the first lower insulating pattern 121 may overlap the semiconductor pattern 131 of the first transistor TR1 in at least some regions in the thickness direction (third direction DR3). For example, the side surface of the semiconductor pattern 131 of the first transistor TR1 may be aligned with the side surface of the first lower insulating pattern 121, or may be disposed inward from the side surface of the first lower insulating pattern 121.

The planar area of the semiconductor pattern 131 of the first transistor TR1 may be equal to or smaller than the planar area of the first lower insulating pattern 121. The semiconductor pattern 131 of the first transistor TR1 may completely overlap the first buffer opening OPB1, and may be disposed in the first buffer opening OPB1 in a plan view.

The semiconductor pattern 131 of the first transistor TR1 may overlap the first lower conductive pattern 111 in at least some regions. Although not limited thereto, at least some side surfaces of the semiconductor pattern 131 of the first transistor TR1 may protrude outward from the side surface of the first lower conductive pattern 111.

The semiconductor pattern 131 of the first transistor TR1 may include a channel region 131c of the first transistor TR1 overlapping a gate electrode 141 of the first transistor TR1 in the thickness direction, and a first source/drain region 131a of the first transistor TR1 and a second source/drain region 131b of the first transistor TR1, which may be located at a side and another side of the channel region 131c, respectively. The first and second source/drain regions 131a and 131b of the first transistor TR1 may be regions including carrier ions, and have higher conductivity and lower electrical resistance than the channel region 131c of the first transistor TR1.

The semiconductor layer 130 may be made of polycrystalline silicon. The polycrystalline silicon may be formed by crystallizing amorphous silicon using a crystallization method such as rapid thermal annealing (RTA), solid phase crystallization (SPC), excimer laser annealing (ELA), metal induced crystallization (MIC), metal induced lateral crystallization (MILC), or sequential lateral solidification (SLS). However, the invention is not limited thereto, and the semiconductor layer 130 may include an oxide semiconductor.

The semiconductor pattern 131 of the first transistor TR1 may be disposed on the substantially flat first lower insulating pattern 121, and the semiconductor pattern 131 of the first transistor TR1 may also be disposed to be substantially flat. For example, even in case that the first lower conductive pattern 111 overlapping a part of the semiconductor pattern 131 of the first transistor TR1 in the thickness direction (third direction DR3) may be disposed under the semiconductor pattern 131 of the first transistor TR1, the semiconductor pattern 131 of the first transistor TR1 may be disposed to be substantially flat with no step. Therefore, in the crystallization process, it may be possible to suppress or prevent a phenomenon in which polycrystalline silicon may be broken in the vicinity of the step, which may occur in case that a step may be present.

Consequently, in case that the first lower conductive pattern 111 may be disposed under the semiconductor pattern 131 of the first transistor TR1, the driving characteristics of the first transistor TR1 may be improved, and the first lower insulating pattern 121 on the first lower conductive pattern 111 may be formed to be flat, thereby placing the semiconductor pattern 131 of the first transistor TR1 to easily crystallize the semiconductor pattern 131.

A description has been made based on the semiconductor pattern 131 of the first transistor TR1, but the description may be applied to the semiconductor pattern 132 of the second transistor TR2. Therefore, a redundant description is omitted.

The first gate insulating layer GI1 may be disposed on the semiconductor layer 130. The first gate insulating layer GI1 may be generally disposed over the entire surface of the base substrate 101. The first gate insulating layer GI1 may cover not only the upper surface of the semiconductor layer 130, but also cover the side surfaces of the semiconductor layer 130. The first gate insulating layer GI1 may cover not only the upper surface of the lower insulating layer 120, but also cover the side surfaces of the lower insulating layer 120. The first gate insulating layer GI1 may cover a part of the upper surface of the barrier layer 102. For example, the first gate insulating layer GI1 may cover a part of the upper surface of the barrier layer 102 exposed by the first buffer opening OPB1 and the second buffer opening OPB2.

The first gate insulating layer GI1 may cover the upper and side surfaces of the first lower insulating pattern 121 and the second lower insulating pattern 122 and extend downward in the third direction DR3 to cover the side surface of the space ES.

The first gate insulating layer GI1 may include a silicon compound, a metal oxide, or the like, or a combination thereof. For example, the first gate insulating layer GI1 may include silicon oxide, silicon nitride, silicon oxynitride, aluminum oxide, tantalum oxide, hafnium oxide, zirconium oxide, titanium oxide, or the like. These may be used alone or in combination with each other.

The second conductive layer 140 may be disposed on the first gate insulating layer GI1. The second conductive layer 140 may include a gate electrode 141 of the first transistor TR1 (or a first gate electrode), a gate electrode 142 of the second transistor TR2 (or a second gate electrode 142), a second electrode of the capacitor Cst, and a scan wiring 144. The scan wiring 144 may have substantially the same configuration as the above-described scan line SL (refer to FIG. 3), but for convenience of description, a different reference numeral 144 is given as below.

The gate electrode 141 of the first transistor TR1 and the second electrode 143 of the capacitor Cst may be integrally formed. For example, the second electrode 143 of the capacitor Cst may be formed of the gate electrode 141 itself of the first transistor TR1, or may be formed of a portion extending from the gate electrode 141 of the first transistor TR1.

For example, a part of the pattern of the integrated second conductive layer 140 may overlap the semiconductor pattern 131 of the first transistor TR1 and function as a gate electrode 141 of the first transistor TR1 at the corresponding site, and another part thereof may function as a second electrode of the capacitor Cst not overlapping the semiconductor pattern 131 of the first transistor TR1 and overlapping the first electrode 151 of the capacitor Cst.

Some of the patterns of the second conductive layer 140 may overlap the second conductive pattern 164 of the fourth conductive layer 160, and may be electrically connected to the second conductive pattern 164 of the fourth conductive layer 160 through a contact hole CNT3.

The gate electrode 142 of the second transistor TR2, and the scan wiring 144 may be integrally formed. For example, the gate electrode 142 of the second transistor TR2 may be formed of the scan wiring 144 itself, or may be formed of a portion extending from the scan wiring 144. For example, some of the patterns of the integrated second conductive layer 140 may overlap the semiconductor pattern 132 of the second transistor TR2 and others thereof may function as the scan wiring 144 transmitting a scan signal. The scan wiring 144 may be disposed under one pixel PX (or under the circuit area CA) on a plane. The scan wiring 144 may extend in the first direction DR1. The scan wiring 144 may extend to another pixel PX located adjacent to the one pixel PX.

The second conductive layer 140 may be made of a low-resistance material. The second conductive layer 140 may include, but is not limited to, at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second gate insulating layer GI2 may be disposed on the second conductive layer 140. The second gate insulating layer GI2 may be generally disposed over the entire surface of the base substrate 101. The second gate insulating layer GI2 may cover not only the upper surface of the second conductive layer 140, but also cover the side surfaces of the second conductive layer 140.

The second gate insulating layer GI2 may include a silicon compound, a metal oxide, or the like, or a combination thereof. For example, the second gate insulating layer GI2 may include silicon oxide, silicon nitride, silicon oxynitride, aluminum oxide, tantalum oxide, hafnium oxide, zirconium oxide, titanium oxide, or the like. These may be used alone or in combination with each other.

The third conductive layer 150 may be disposed on the second gate insulating layer GI2. The third conductive layer 150 may include a first electrode 151 of the capacitor Cst. The first electrode 151 of the capacitor Cst may form a capacitor Cst while facing the second electrode 143 of the underlying capacitor Cst in an area where the first electrode 151 of the capacitor Cst overlaps the second electrode 143 of the underlying capacitor Cst. In the overlapping region, the second gate insulating layer GI2 disposed between the first electrode 151 of the capacitor Cst and the second electrode 143 of the capacitor Cst may serve as a dielectric of the capacitor Cst.

The first electrode 151 of the capacitor Cst may overlap a first power supply wiring 161 of the fourth conductive layer 160, and may be electrically connected to the first power supply wiring 161 of the fourth conductive layer 160 in the overlapping region.

The third conductive layer 150 may include, but is not limited to, at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The interlayer insulating layer ILD may be disposed on the third conductive layer 150. The interlayer insulating layer ILD may include a silicon compound, a metal oxide, or the like, or a combination thereof. For example, the interlayer insulating layer ILD may include silicon oxide, silicon nitride, silicon oxynitride, aluminum oxide, tantalum oxide, hafnium oxide, zirconium oxide, titanium oxide, or the like. These may be used alone or in combination with each other.

The fourth conductive layer 160 may be disposed on the interlayer insulating layer ILD. The fourth conductive layer 160 may include a first power supply wiring 161, a first source/drain electrode 161a of the first transistor TR1 branched from the first power supply wiring 161, a data wiring 162, a first source/drain electrode 162a of second transistor TR2 branched from the data wiring 162, a first conductive pattern 163, and a second conductive pattern 164. The first power supply wiring 161 and the data wiring 162 may be substantially the same as the first power supply line (ELVDL, refer to FIG. 3) and the data line (DL, refer to FIG. 3), respectively, but for convenience of description, other reference numerals 161 and 162 are given below.

The first power supply wiring 161 may be disposed at the right side of one pixel PX on a plane. The first power supply wiring 161 may extend in the second direction DR2. The first power supply wiring 161 may extend to another pixel PX located adjacent to the one pixel PX in the second direction DR2. A part of the first power supply wiring 161 may be disposed in the first transistor region TRR1. In the drawing, a part of the first power supply wiring 161 extending in the second direction DR2 may protrude in the first direction DR1, and the protruding portion may extend to be disposed in the first transistor region TRR1. However, the invention is not limited thereto.

The protruding portion may include the first source/drain electrode 161a of the first transistor TR1. For example, in some of the patterns of the fourth conductive layer 160, the first source/drain electrode 161a of the first transistor TR1 and the first power supply wiring 161 may be integrally formed. The pattern may function as the first source/drain electrode 161a of the first transistor TR1 in a portion overlapping the semiconductor pattern 131 of the first transistor TR1, and may function as the first power supply wiring 161 in a portion not overlapping the semiconductor pattern 131 of the first transistor TR1.

In the portion overlapping the semiconductor pattern 131 of the first transistor TR1, the first source/drain electrode 161a of the first transistor TR1 may be electrically connected to the semiconductor pattern 131 of the first transistor TR1 through a contact hole CNT5 penetrating the interlayer insulating layer IDL, the second gate insulating layer GI2, and the first gate insulating layer GI1 to expose the semiconductor pattern 131 of the first transistor TR1.

The data wiring 162 may be disposed at the left side of one pixel PX on a plane. The data wiring 162 may extend in the second direction DR2. The data wiring 162 may extend to another pixel PX located adjacent to one pixel PX in the second direction DR2. A part of the data wiring 162 may be disposed in the second transistor region TRR2. In the drawing, a part of the data wiring 162 extending in the second direction DR2 protrudes in the first direction DR1, and the protruding portion may extend to be disposed in the second transistor region TRR2. However, the invention is not limited thereto.

The protruding portion may include the first source/drain electrode 162a of the second transistor TR2. For example, in some of the patterns of the fourth conductive layer 160, the first source/drain electrode 162a of the second transistor TR2 and the data wiring 162 may be integrally formed. The pattern may function as the first source/drain electrode 162a of the second transistor TR2 in a portion overlapping the semiconductor pattern 132 of the second transistor TR1, and may function as the data wiring 162 in a portion not overlapping the semiconductor pattern 132 of the second transistor TR2.

In the portion overlapping the semiconductor pattern 132 of the second transistor TR2, the first source/drain electrode 162a of the second transistor TR2 may be electrically connected to the semiconductor pattern 132 of the second transistor TR2 through a contact hole CNT6 penetrating the interlayer insulating layer IDL, the second gate insulating layer GI2, and the first gate insulating layer GI1 to expose the semiconductor pattern 132 of the second transistor TR2.

The first conductive pattern 163 may be disposed around the center of one pixel PX on the plane. The first conductive pattern 163 may be disposed for each pixel PX. A part of the first conductive pattern 163 may be disposed in the first transistor region TRR1, and a part of the first conductive pattern 163 may function as the second source/drain electrode 161b of the first transistor TR1. A part of the first conductive pattern 163 may overlap the semiconductor pattern 131 of the first transistor TR1. In the overlapping region, the second source/drain electrode 161b of the first transistor TR1 may be electrically connected to the semiconductor pattern 131 of the first transistor TR1 through a contact hole CNT7 penetrating the interlayer insulating layer IDL, the second gate insulating layer GI2, and the first gate insulating layer GI1 to expose the semiconductor pattern 131 of the first transistor TR1.

The second conductive pattern 164 may be disposed around the lower side of one pixel PX on the plane. The second conductive pattern 164 may be disposed for each pixel PX. A part of the second conductive pattern 164 may be disposed in the second transistor region TRR2, and a part of the second conductive pattern 164 may function as the second source/drain electrode 162b of the second transistor TR2. A part of the second conductive pattern 164 may overlap the semiconductor pattern 132 of the second transistor TR2. In the overlapping region, the second source/drain electrode 162b of the second transistor TR2 may be electrically connected to the semiconductor pattern 132 of the second transistor TR2 through a contact hole CNT8 penetrating the interlayer insulating layer IDL, the second gate insulating layer GI2, and the first gate insulating layer GI1 to expose the semiconductor pattern 132 of the second transistor TR2.

The fourth conductive layer 160 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 160 may be a single-layer film or a multi-layer film. For example, the fourth conductive layer 160 may be formed to have a laminated structure of Ti/Al/Ti, Mo/Al/Mo, Mo/AlGe/Mo, or Ti/Cu.

The via layer VIA may be disposed on the fourth conductive layer 160. The via layer VIA may be disposed on the fourth conductive layer 160 to completely cover the upper surface of the fourth conductive layer 160. In case that the via layer VIA may be formed of an organic layer, the upper surface thereof may be flat despite a lower step.

The via layer VIA may include an inorganic insulating material, an organic insulating material such as polyacrylate resin, epoxy resin, phenolic resin, polyamide resin, polyimide resin, unsaturated polyester resin, polyphenylenether resin, polyphenylene sulfide resin, benzocyclobutene (BCB), or a combination thereof. The via layer VIA may further include a photosensitive material, but the material thereof is not limited thereto.

A passivation layer (not shown) covering the fourth conductive layer 160 may be further disposed under the via layer VIA.

The anode electrode ANO may be disposed on the via layer VIA. The anode electrode ANO may be disposed separately for each pixel. The anode electrode ANO may be electrically connected to the second source/drain region 161b of the first transistor TR1 through a contact hole CNT9 penetrating the via layer VIS to expose a part of the second source/drain region 161b of the first transistor TR1. The anode electrode ANO may be disposed in the display area DA, and may not be disposed in the non-display area NDA.

The anode electrode ANO may have a laminated film structure in which a high-work-function material layer including Indium-Tin-Oxide (ITO), Indium-Zinc-Oxide (IZO), Zinc Oxide (ZnO), or Indium Oxide ($In_2O_3$) and a reflective material layer including silver (Ag), magnesium (Mg), aluminum (Al), platinum (Pt), lead (Pd), gold (Au), nickel (Ni), neodymium (Nd), iridium (Ir), chromium (Cr), Lithium (Li), calcium (Ca) or a mixture thereof may be laminated. The high-work-function material layer may be disposed over the reflective material layer to be closer to the light emitting layer EL. The anode electrode ANO may have a multi-layer structure of ITO/Mg, ITO/MgF, ITO/Ag, or ITO/Ag/ITO, but the invention is not limited thereto.

The pixel defining layer PDL may be disposed on the anode electrode ANO. The pixel defining layer PDL may include an opening partially exposing the anode electrode ANO. The pixel defining layer PDL may include an organic insulating material, an inorganic insulating material, or a combination thereof. For example, the pixel defining layer PDL may include at least one of polyimide resin, acrylic resin, a silicon compound, and polyacrylic resin.

The light emitting layer EL, the cathode electrode CAT, and the thin film encapsulation layer 170 may be further disposed on the anode electrode ANO exposed by the pixel defining layer PDL.

The light emitting layer EL may include an organic material layer. The organic material layer of the light emitting layer EL may include an organic light emitting layer, and may further include a hole injection/transport layer and/or an electron injection/transport layer.

The cathode electrode CAT may be disposed on the light emitting layer EL. The cathode electrode CAT may be a common electrode that may be entirely disposed regardless of the pixels PX. The anode electrode ANO, the light emitting layer EL, and the cathode electrode CAT may constitute an organic light emitting element OLED.

The cathode electrode CAT may include a low-work-function material layer including Li, Ca, LiF/Ca, LiF/Al, Al, Mg, Ag, Pt, Pd, Ni, Au Nd, Ir, Cr, BaF, Ba, a compound thereof, or a mixture thereof (for example, a mixture of Ag and Mg). The cathode electrode CAT may further include a transparent metal oxide layer disposed on the low-work-function material layer.

The thin film encapsulation layer 170 may be disposed on the cathode electrode CAT. The thin film encapsulation layer 170 may include a first inorganic layer 171, a first organic layer 172, and a second inorganic layer 173. Although not shown, at the ends of the thin film encapsulation layer 170, the first inorganic layer 171 and the second inorganic layer 173 may contact each other. The first organic layer 172 may be encapsulated by the first inorganic layer 171 and the second inorganic layer 173.

Each of the first inorganic layer 171 and the second inorganic layer 173 may each include silicon nitride, silicon oxide, silicon oxynitride, or a combination thereof. The first organic layer 172 may include an organic insulating material.

Hereinafter, a method of manufacturing the display device 1 according to an embodiment will be described.

Figure 8:
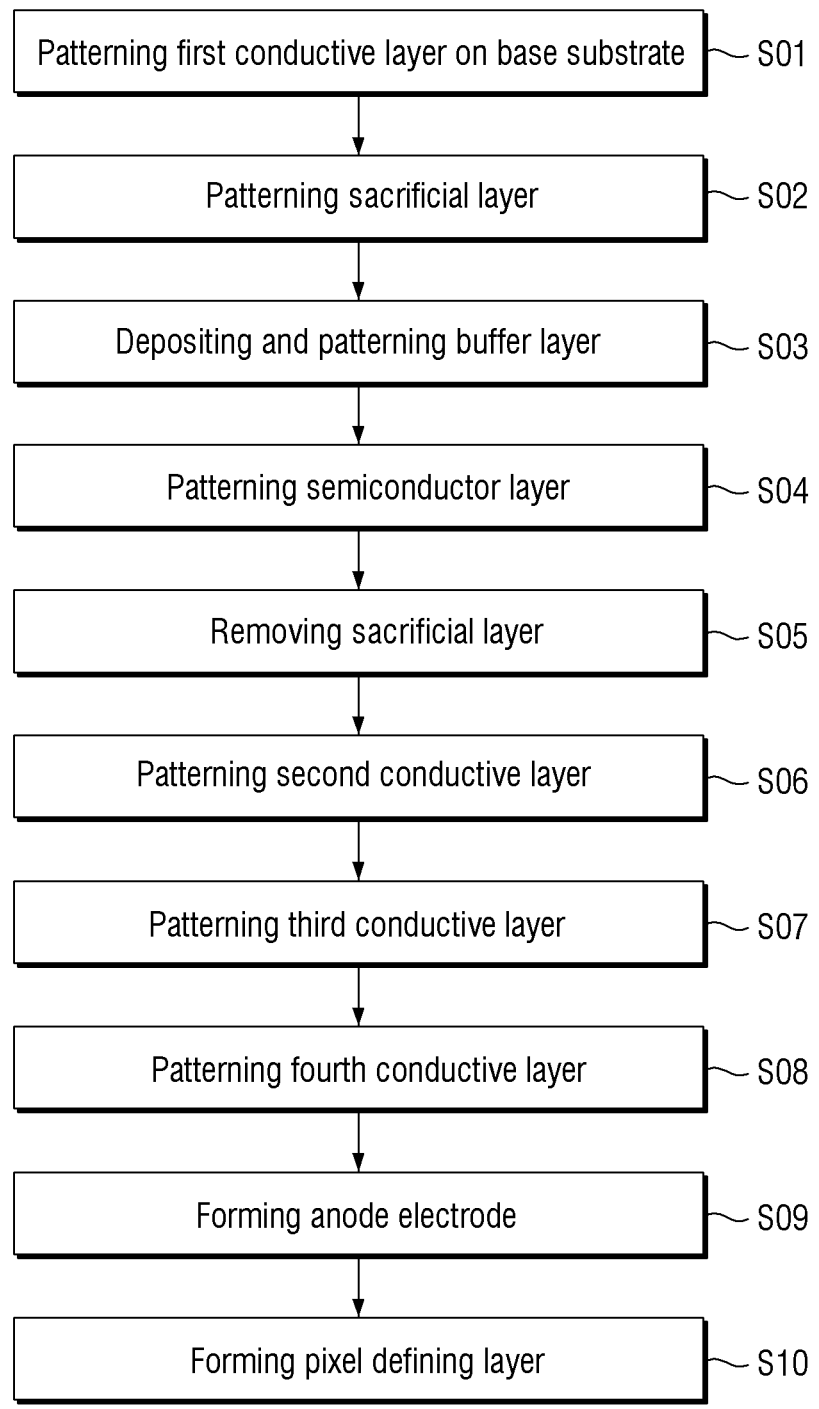
FIG. 8 is a flowchart of a method of manufacturing a display device according to an embodiment.

FIG. 8 is a flowchart of a method of manufacturing a display device according to an embodiment, and FIGS. 9 to 18 are schematic cross-sectional views illustrating the process steps of a method of manufacturing a display device according to an embodiment.

Figure 9:
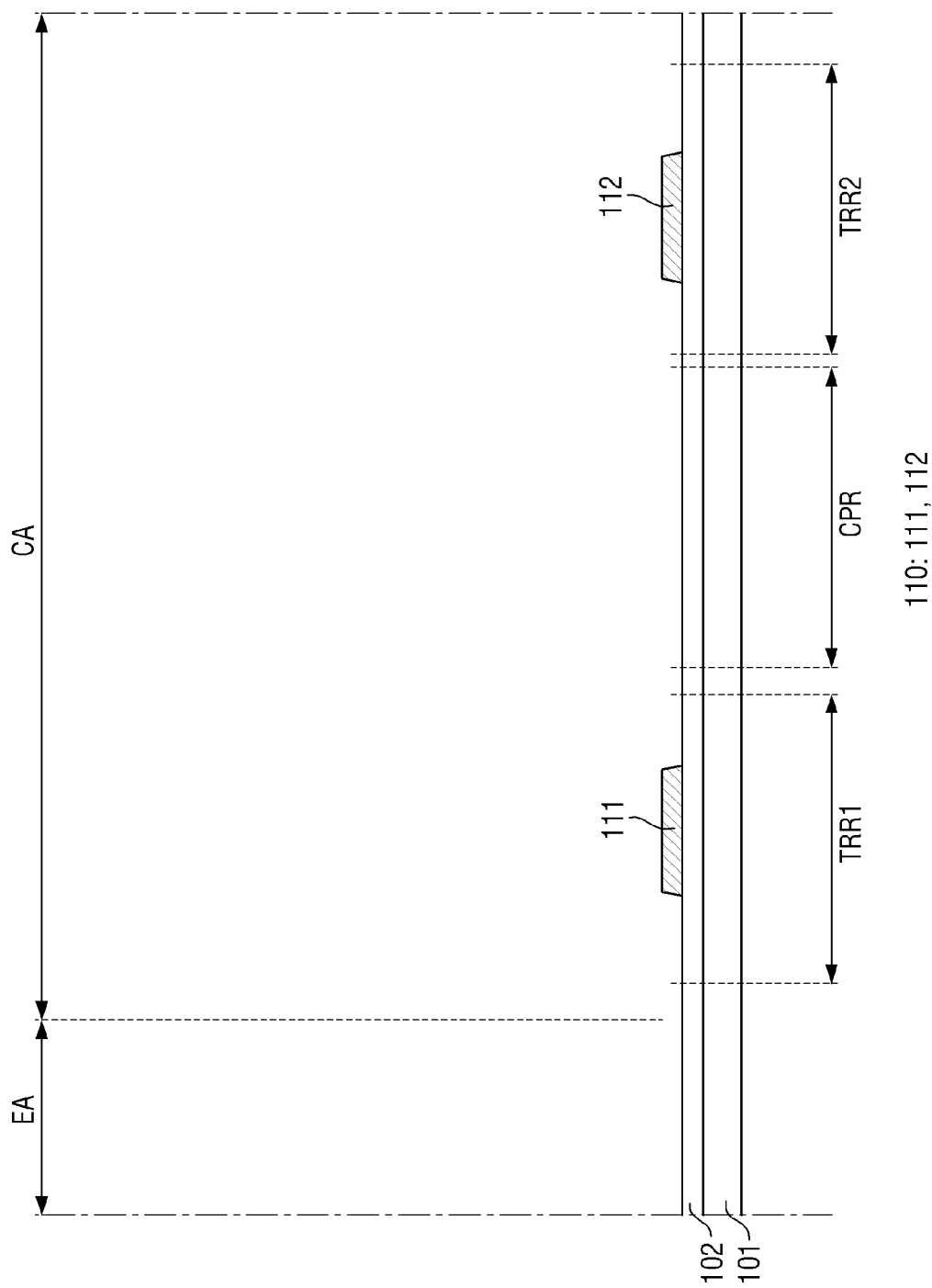
FIGS. 9 to 18 are schematic cross-sectional views illustrating process steps of a method of manufacturing a display device according to an embodiment.

Referring to FIGS. 8 and 9, first, a barrier layer 102 may be formed on the entire surface of a base substrate 101, and a first conductive layer 110 that may be patterned may be formed on the barrier layer 102 (S01).

The first conductive layer 110 that may be patterned may be formed by a mask process. For example, a material layer for a first conductive layer may be entirely deposited on the barrier layer 102, and patterned by a photolithography process to form the first conductive layer 110 including a first lower conductive pattern 111 and a second lower conductive pattern 112 as shown in FIG. 9.

Figure 10:
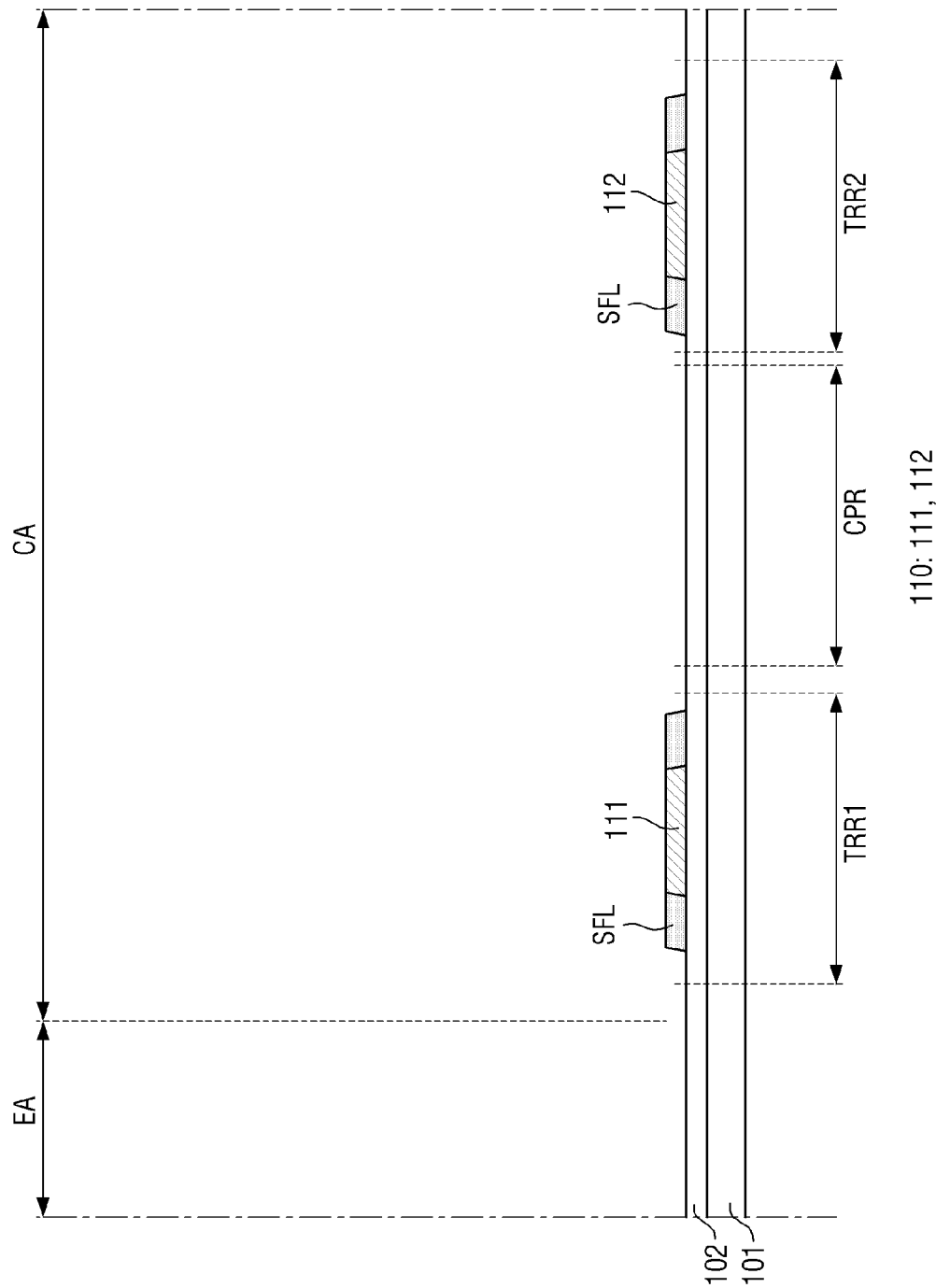

Subsequently, referring to FIG. 10, a sacrificial layer SFL that may be patterned may be formed on the barrier layer 102 (S02).

The sacrificial layer SFL that may be patterned may be formed by a mask process. For example, a material layer for a sacrificial layer may be entirely deposited on the barrier layer 102 while covering the first conductive layer 110, and patterned by a photolithography process to form the sacrificial layer SFL as shown in FIG. 10.

The sacrificial layer SFL may be disposed around the first conductive layer 110. The sacrificial layer SFL may be disposed on the barrier layer 102, and simultaneously may be disposed on the side surface of the first conductive layer 110. The thickness (width in the third direction DR3) of the patterned sacrificial layer SFL may be substantially the same as the thickness (width in the third direction DR3) of the first conductive layer 110. A height difference may not exist between the upper surface of the sacrificial layer SFL and the upper surface of the first conductive layer 110. For example, the upper surface of the sacrificial layer SFL may be as same as the extending surface of the upper surface of the first conductive layer 110.

Therefore, the lower surface of the lower insulating layer 120 (refer to FIG. 11) disposed on the sacrificial layer SFL and the first conductive layer 110 may be substantially flat. Accordingly, the upper surface of the lower insulating layer 120 (refer to FIG. 11) disposed on the sacrificial layer SFL and the first conductive layer 110 may also be substantially flat, and the semiconductor layer 130 (refer to FIG. 12) disposed on the lower insulating layer 120 (refer to FIG. 11) may also be substantially flat.

The sacrificial layer SFL may include titanium (Ti). However, the invention is not limited thereto, and the sacrificial layer SFL may be formed of a photoresist pattern. The photoresist pattern may be removed by an ashing process or the like.

Figure 11:
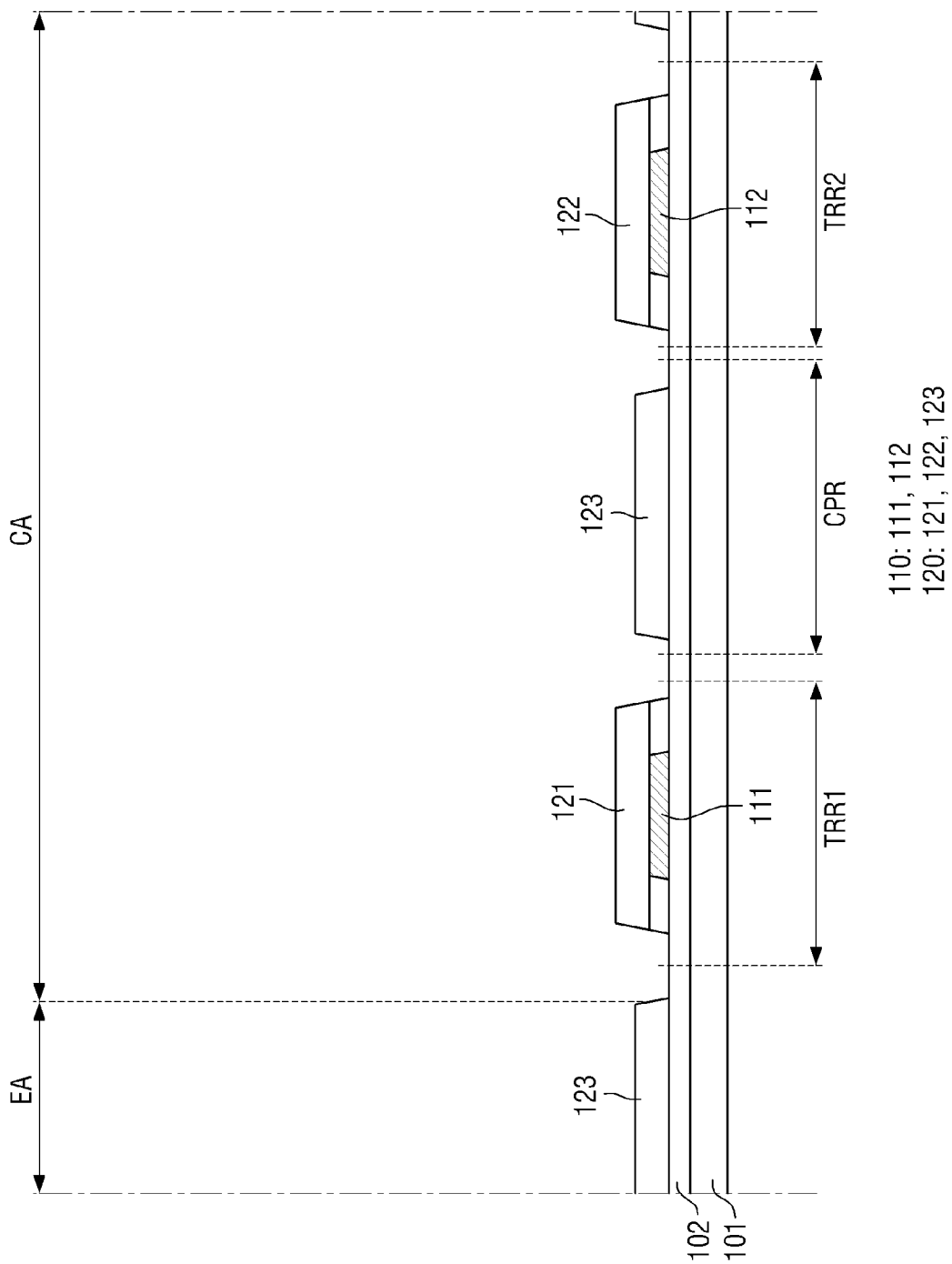

Subsequently, referring to FIG. 11, a patterned lower insulating layer 120 may be formed on the barrier layer on which the patterned first conductive layer 110 and the sacrificial layer SFL may be disposed (S03).

The patterned lower insulating layer 120 may be formed by a mask process. For example, a material layer for a lower insulating layer may be entirely deposited on the barrier layer 102 to cover the patterned first conductive layer 110 and the sacrificial layer SFL, and patterned by a photolithography process to form the lower insulating layer 120 including a first lower insulating pattern 121, a second lower insulating pattern 122, and a third lower insulating pattern 123 as shown in FIG. 11.

The lower insulating layer 120 may include a first lower insulating pattern 121, a second lower insulating pattern 122, and a third lower insulating pattern 123, and these components may be at least partially separated. In the separated region, the lower insulating layer 120 may expose at least a part of the sacrificial layer SFL.

Figure 12:
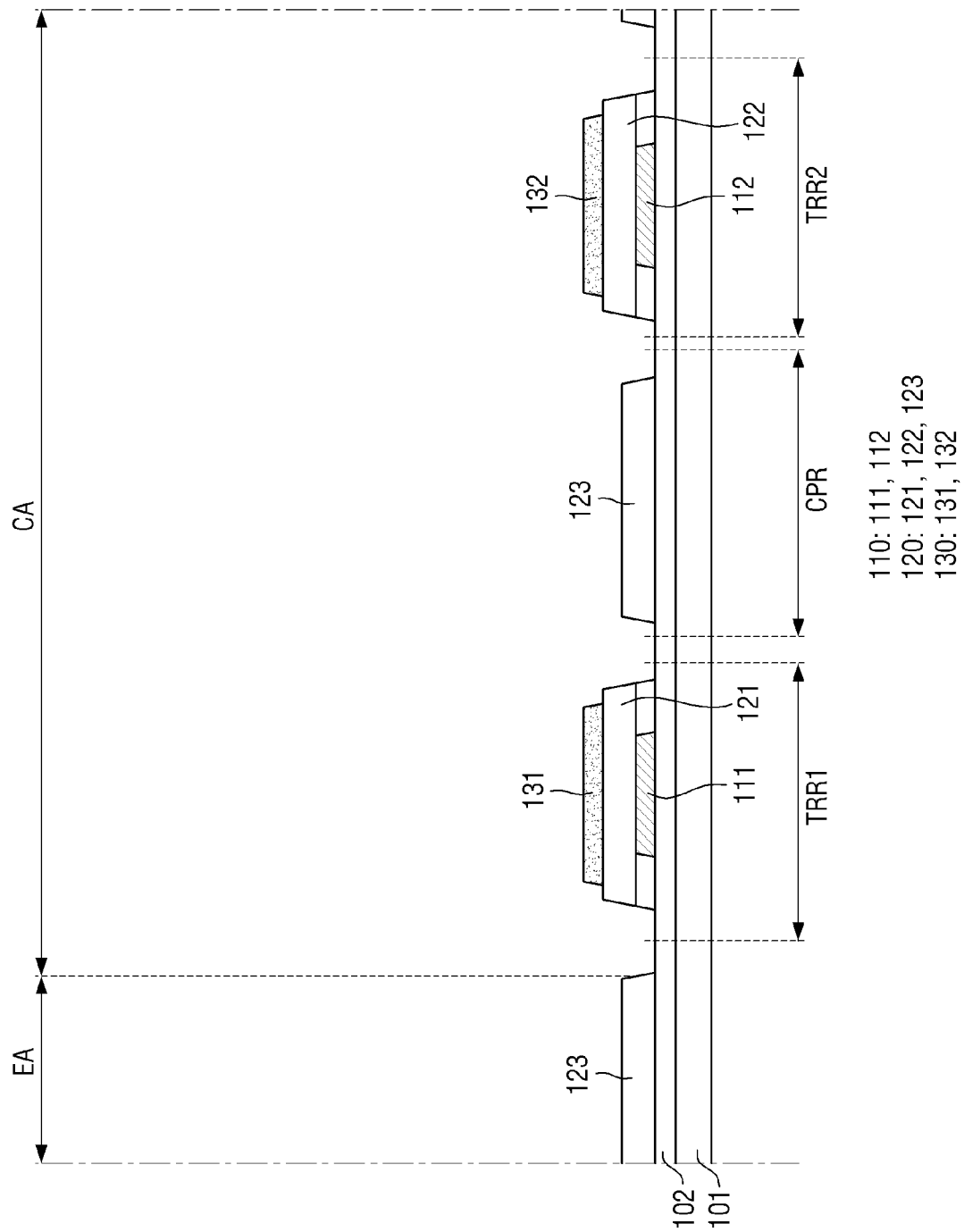

Subsequently, referring to FIG. 12, a patterned semiconductor layer 130 may be formed on the patterned lower insulating layer 120 (S04).

The patterned semiconductor layer 130 may be formed by a mask process. For example, a material layer for a semiconductor layer may be entirely deposited on the patterned lower insulating layer 120, and patterned by a photolithography process to form the semiconductor layer 130 including a first semiconductor pattern 131 and a second semiconductor pattern 132 as shown in FIG. 12.

The first lower insulating pattern 121 may be disposed on the first lower conductive pattern 111 and the sacrificial layer SFL, and may be substantially flat without a step. The second lower insulating pattern 122 may be disposed on the second lower conductive pattern 112 and the sacrificial layer SFL, and may be substantially flat without a step.

Figure 13:
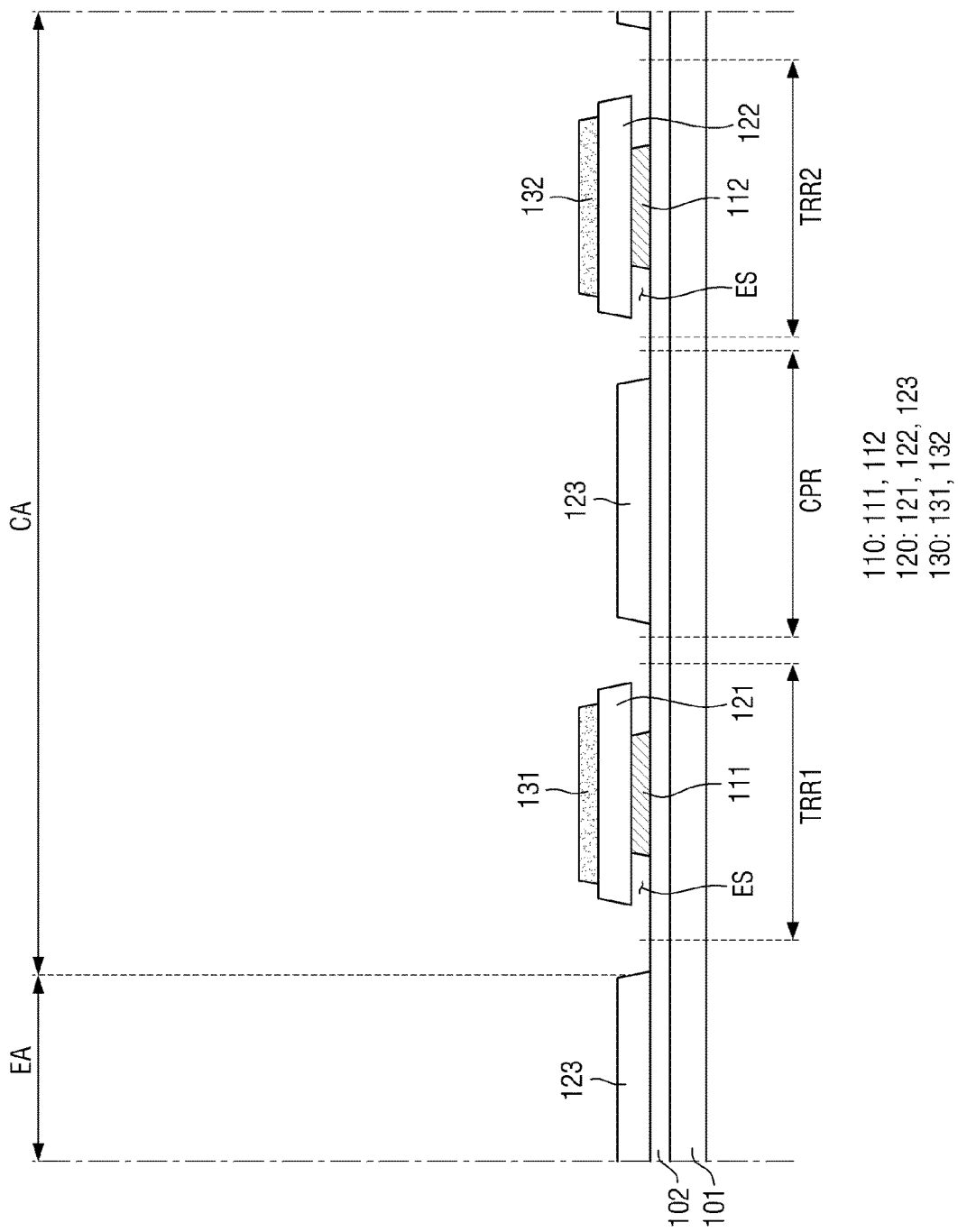

Subsequently, referring to FIG. 13, the sacrificial layer SFL may be removed by etching (S05).

The sacrificial layer SFL may be removed by wet-etching the sacrificial layer SFL using the patterned lower insulating layer 120 as a mask. In other words, the sacrificial layer SFL may be etched and removed through the lower insulating layer 120 exposing at least a part of the sacrificial layer SFL. In the wet etching process, a hydrogen fluoride (HF) solution may be used, but the invention is not limited thereto. In the etching process, hydrogen fluoride (HF) may remove the sacrificial layer SFL by selectively etching only the sacrificial layer SFL, and other components may remain.

As the sacrificial layer SFL may be removed, a part of the first lower insulating pattern 121 and a part of the second lower insulating pattern 122, overlapping the sacrificial layer SFL, may be spaced apart from the underlying barrier layer 102 in a thickness direction (third direction DR3), and a space ES may be formed. Regions protruding from the first lower insulating pattern 121 and the second lower insulating pattern 122 to the side surfaces of the first lower conductive pattern 111 and the second lower conductive pattern 112 may not descend downward because most of the regions of the first lower insulating pattern 121 and the second lower insulating pattern 122 may be supported by the first lower conductive pattern 111 and the second lower conductive pattern 112 even in case that there may be no configuration supporting the regions.

Although not shown in the drawing, after the sacrificial layer SFL may be removed, the first semiconductor pattern 131 and the second semiconductor pattern 132 may be crystallized according to the above-described crystallization method. However, the invention is not limited thereto. After the first semiconductor pattern 131 and the second semiconductor pattern 132 may be crystallized, the sacrificial layer SFL may be removed.

Figure 14:
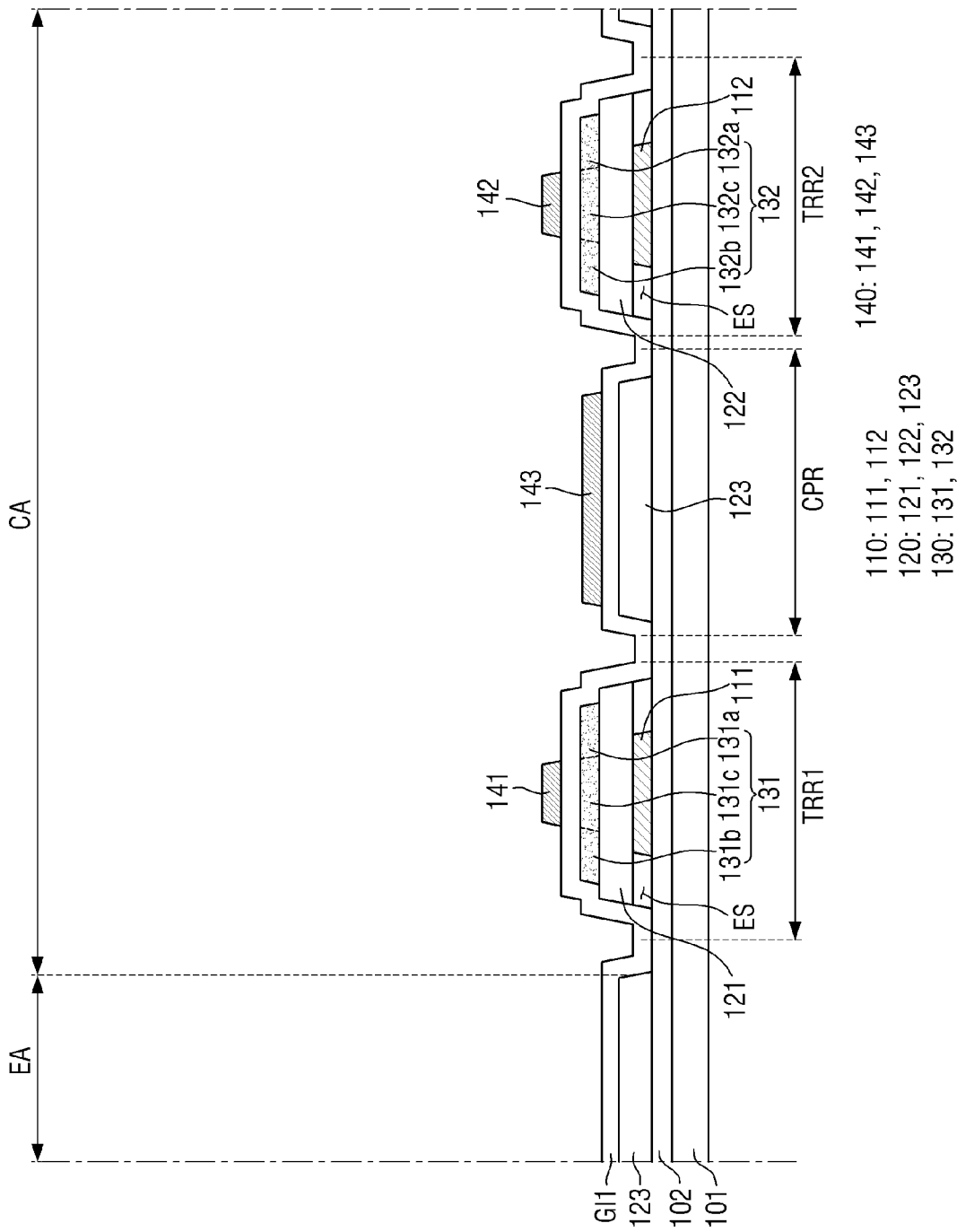

Subsequently, referring to FIG. 14, a first gate insulating layer GI1 may be entirely deposited on the lower insulating layer 120 on which the semiconductor layer 130 may be disposed, and a second conductive layer 140 may be formed on the first gate insulating layer GI1 (S06). A first gate insulating layer GI1 may be entirely deposited on the lower insulating layer 120 on which the semiconductor layer 130 may be disposed, and a patterned second conductive layer 140 may be formed on the first gate insulating layer GI1. The patterned second conductive layer 140 may be formed by a mask process. For example, a material layer for a second conductive layer may be entirely deposited on the first gate insulating layer GI1, and patterned by a photolithography process to form the second conductive layer 140 including a first gate electrode 141, a second gate electrode 142, and a second electrode 143 of a capacitor Cst as shown in FIG. 14.

The first gate insulating layer GI1 may cover the upper and side surfaces of the patterned lower insulating layer 120. The first gate insulating layer GI1 may cover the upper and side surfaces of the patterned semiconductor layer 130. The first gate insulating layer GI1 may cover a part of the upper surface of the barrier layer 102. The first gate insulating layer GI1 may be located among the first lower insulating pattern 121, the second lower insulating pattern 122, and the third lower insulating pattern 123.

Figure 15:
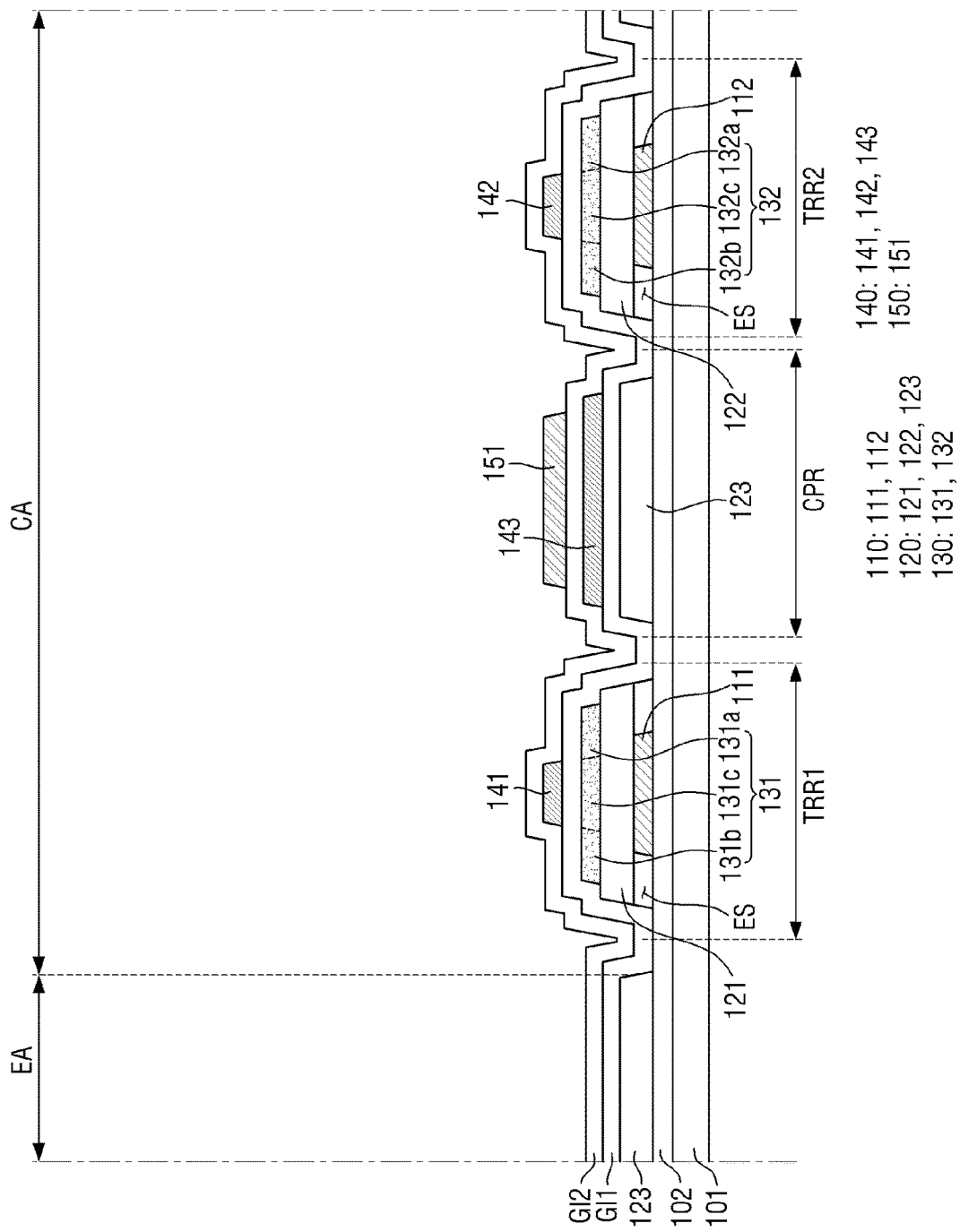

Subsequently, referring to FIG. 15, a second gate insulating layer GI2 may be entirely deposited on the first gate insulating layer GI1 on which the second conductive layer 140 may be disposed, and a third conductive layer 150 may be formed on the second gate insulating layer GI2 (S07).

A second gate insulating layer GI2 may be entirely deposited on the first gate insulating layer GI1 on which the second conductive layer 140 may be disposed, and a patterned third conductive layer 150 may be formed on the second gate insulating layer GI2. The patterned third conductive layer 150 may be formed by a mask process. For example, a material layer for a third conductive layer may be entirely deposited on the second gate insulating layer GI2, and patterned by a photolithography process to form the third conductive layer 150 including a first electrode 151 of a capacitor Cst as shown in FIG. 15.

Figure 16:
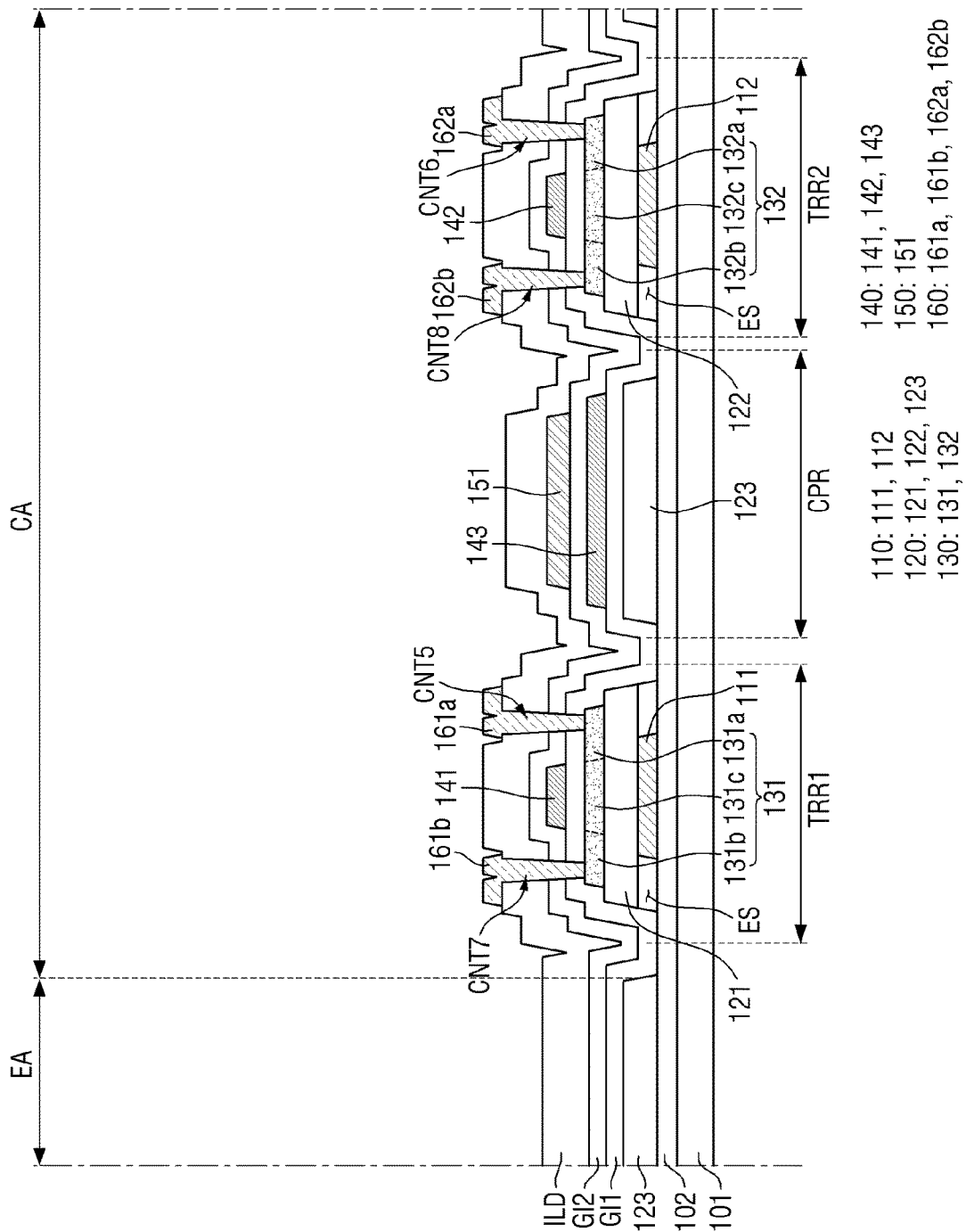

Subsequently, referring to FIG. 16, an interlayer insulating layer ILD may be entirely deposited on the second gate insulating layer GI2 on which the third conductive layer 150 may be disposed, and a fourth conductive layer 160 may be formed on the interlayer insulating layer ILD (S08).

First, an interlayer insulating layer ILD may be entirely deposited on the second gate insulating layer GI2 on which the third conductive layer 150 may be disposed, and contact holes CNT5, CNT6, CNT7, and CNT8 exposing the first semiconductor pattern 131 or the second semiconductor pattern 132 may be formed. The contact holes CNT5, CNT6, CNT7, and CNT8 may be formed by a mask process. A photoresist pattern exposing a part of the first semiconductor pattern 131 or the second semiconductor pattern 132 may be formed on the interlayer insulating layer ILD, and the interlayer insulating layer ILD, the second gate insulating layer GI2, and the first gate insulating layer GI1 may be etched using the photoresist pattern as a mask to form the contact holes CNT5, CNT6, CNT7, and CNT8 exposing a part of the first semiconductor pattern 131 or the second semiconductor pattern 132.

Thereafter, a patterned fourth conductive layer 160 may be formed on the interlayer insulating layer ILD. The patterned fourth conductive layer 160 may be formed by a mask process. For example, a material layer for a fourth conductive layer may be entirely deposited on the interlayer insulating layer ILD. In the deposition process, the material layer for the fourth conductive layer may be deposited up to the inside of the contact holes CNT5, CNT6, CNT7, and CNT8. The first and second source/drain electrodes 161a and 161b of the first transistor TR1 and the first and second source/drain electrodes 162a and 162b of the second transistor TR2 may be physically and/or electrically connected to the first semiconductor pattern 131 and the second semiconductor pattern 132, respectively.

Subsequently, a photoresist layer may be applied onto the material layer for the fourth conductive layer, a photoresist pattern may be formed through exposure and development, and the material layer for the fourth conductive layer may be patterned using this photoresist pattern as an etching mask to complete the fourth conductive layer 160 including first and second source/drain electrodes 161a and 161b of the first transistor TR1 and first and second source/drain electrodes 162a and 162b of the second transistor TR2.

Figure 17:
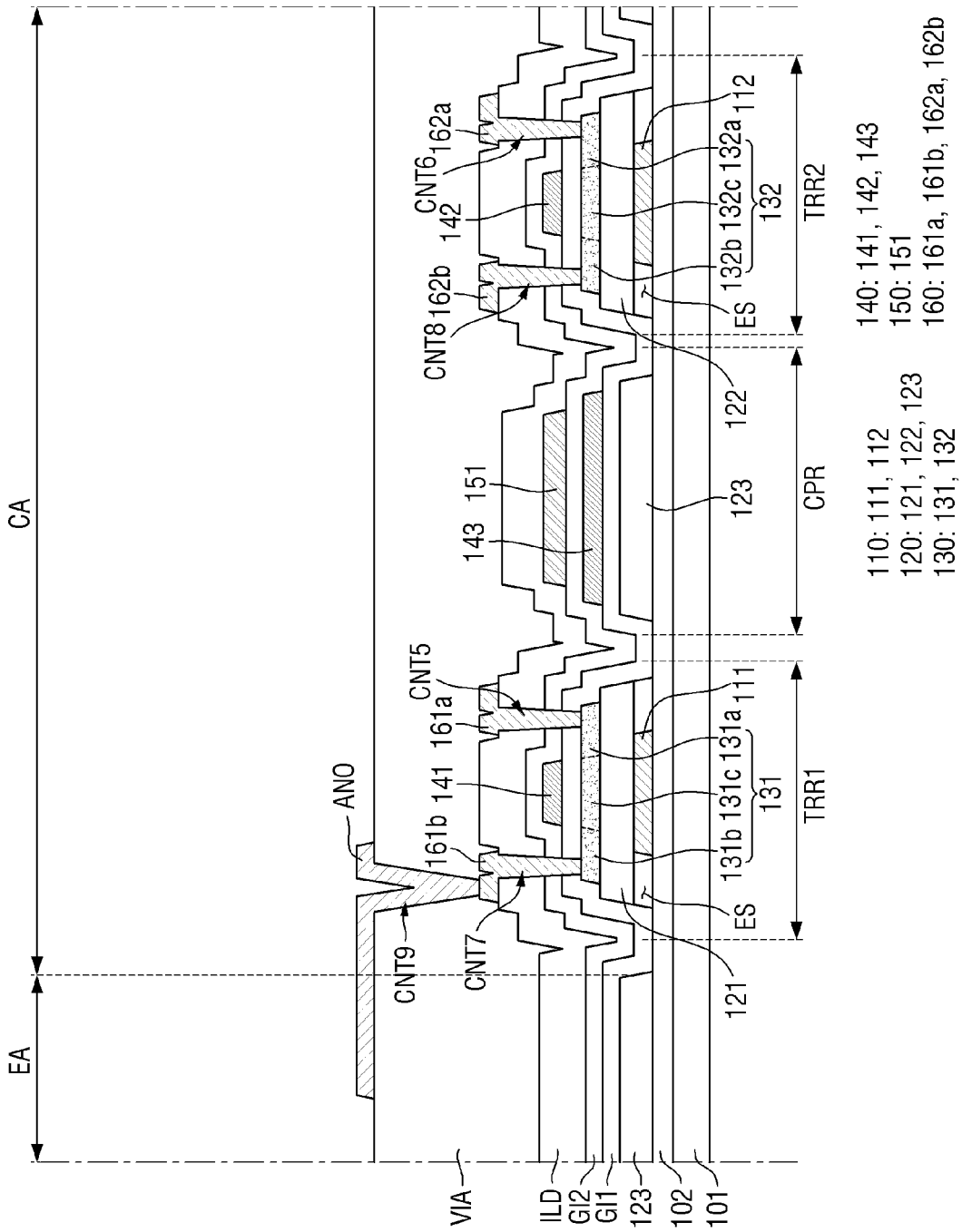

Subsequently, referring to FIG. 17, a via layer VIA may be formed on the fourth conductive layer 160, and an anode electrode ANO may be formed on the via layer VIA (S09).

First, a material layer for a via layer may be applied onto the interlayer insulating layer ILD provided with the fourth conductive layer 160 to form a via layer VIA for covering the fourth conductive layer 160. The via layer VIA may be etched to form a contact hole CNT9 penetrating the via layer VIA to expose a part of the second source/drain electrode 161b of the first transistor TR1.

After the contact hole CNT9 may be formed, an anode electrode ANO may be formed. The anode electrode ANO may be formed by a mask process. For example, a material layer for an anode electrode may be entirely deposited on the via layer VIA. In the deposition process, the material layer for the anode electrode may be deposited up to the inside of the contact hole CNT9. Accordingly, the anode electrode ANO may be electrically connected to the second source/drain electrode 161b of the first transistor TR1. Subsequently, a photoresist layer may be applied onto the material layer for the anode electrode, a photoresist pattern may be formed through exposure and development, and the material layer for the anode electrode may be etched using this photoresist pattern as an etching mask. The photoresist pattern may be removed through a stripping or ashing process to complete the patterned anode electrode ANO as shown in FIG. 17.

Figure 18:
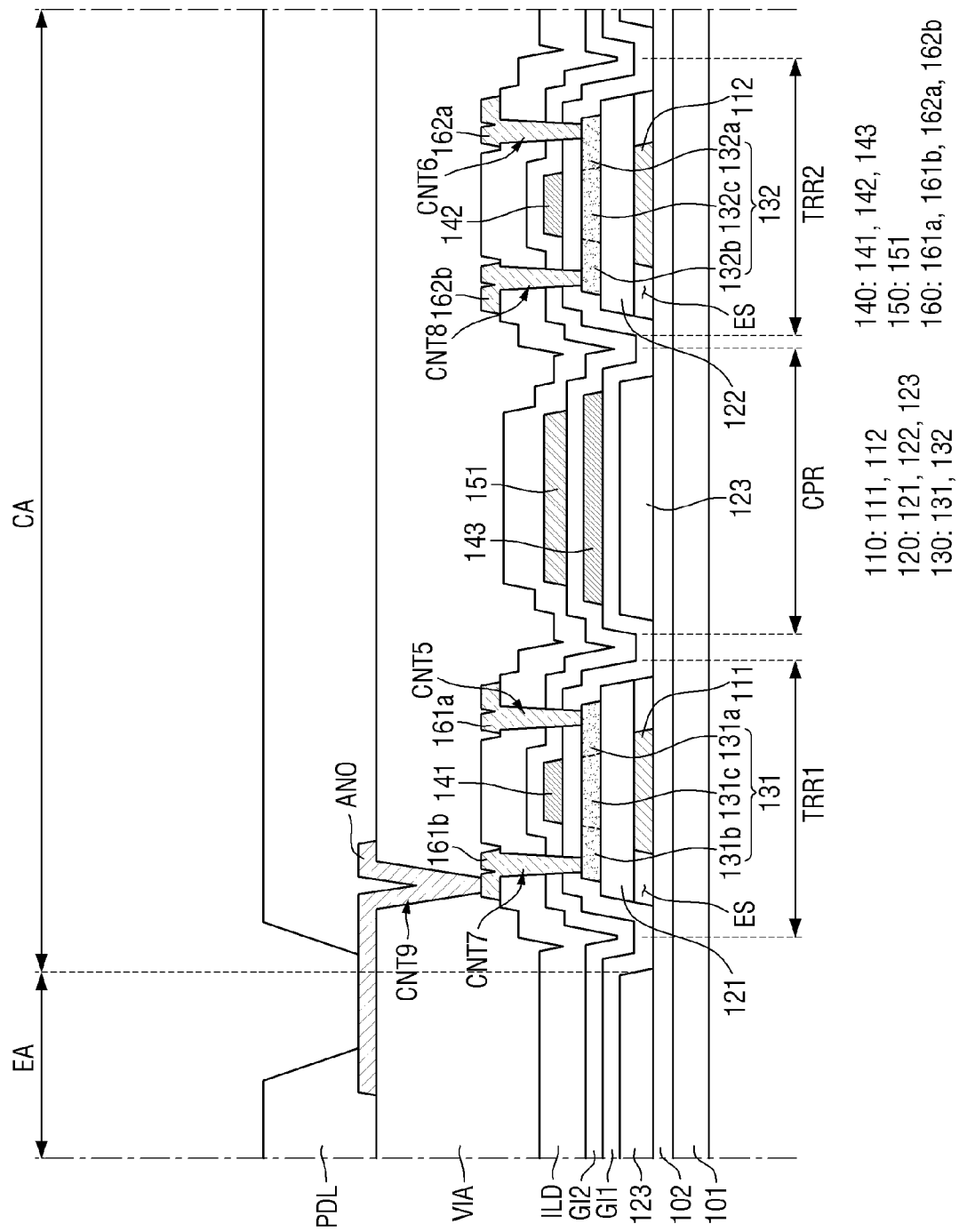

Subsequently, referring to FIG. 18, a patterned pixel defining layer PDL covering the anode electrode ANO may be formed on the via layer VIA (S10).

In detail, the pixel defining layer PDL may include, for example, an organic material including a photosensitive material. The patterned pixel-defining layer (PDL) may be formed through exposure and development after applying an organic material layer for a pixel defining layer.

The pixel defining layer PDL may be formed along the boundary of the pixel PX, and may partially overlap the anode electrode ANO. The pixel defining layer PDL may be formed to overlap the contact hole CNT9. In case that the anode electrode ANO partially fill the inner space of the contact hole CNT9 without completely filling the inner space thereof, the pixel defining layer PDL may completely fill the inner space of the contact hole CNT9.

Since methods for manufacturing the light emitting layer EL (refer to FIG. 7), the cathode electrode CAT (refer to FIG. 7), and the thin film encapsulation layer 170 (refer to FIG. 7) over the pixel defining layer PDL may be known, descriptions of the methods for manufacturing the components is omitted.

Hereinafter, other embodiments will be described. In the following embodiments, for the same components as those previously described, a duplicate description is omitted or simplified, and differences will be described.

Figure 19:
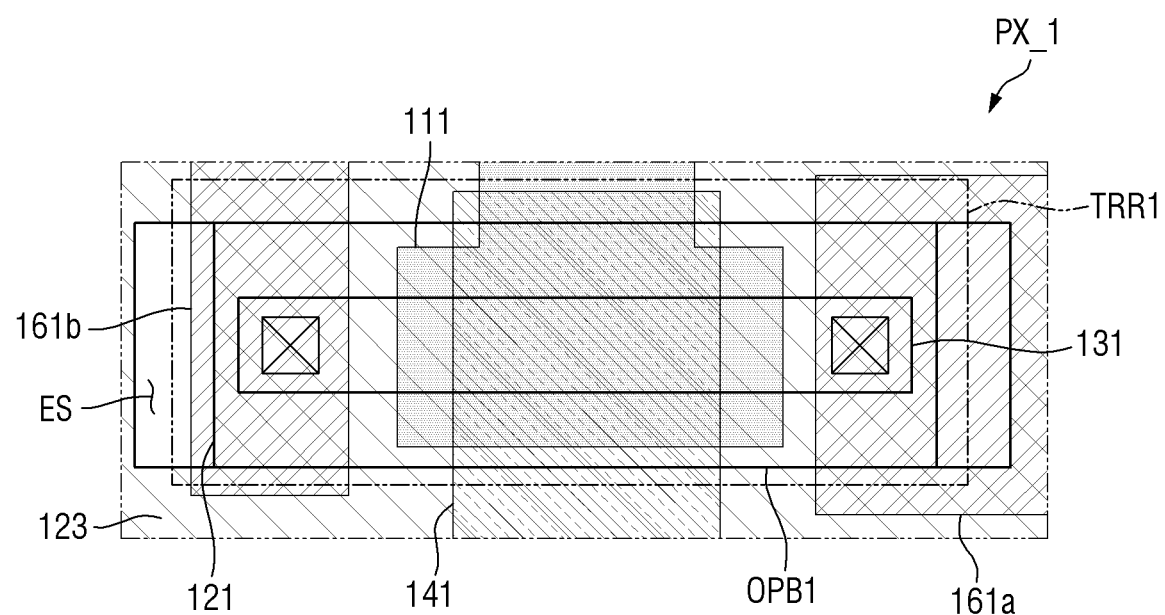
FIG. 19 is an enlarged schematic view of a part of one pixel of a display device according to another embodiment.

FIG. 19 is an enlarged schematic view of a part of one pixel of a display device according to another embodiment.

Referring to FIG. 19, a lower insulating layer 120_1 of the display device of the embodiment may be different from the lower insulating layer 120 of the embodiment of FIG. 4 in that the lower insulating layer 120_1 may include a first lower insulating pattern 121, a second lower insulating pattern 122, and a third lower insulating pattern 123, and the first lower insulating pattern 121, the second lower insulating pattern 122, and the third lower insulating pattern 123 may be integrally formed. Although the second lower insulating pattern 122 is not shown in FIG. 19, a description of the first lower insulating pattern 121 to be described below may be equally applied.

Specifically, the lower insulating layer 120_1 according to the embodiment may include a first lower insulating pattern 121, a second lower insulating pattern 122, and a third lower insulating pattern 123, and the first lower insulating pattern 121, the second lower insulating pattern 122, and the third lower insulating pattern 123 may be partially separated from each other and may be disposed to be extended to each other.

The separated region may expose at least a part of the sacrificial layer SFL (refer to FIG. 13) in the above-described method of manufacturing the display device, and the sacrificial layer SFL (refer to FIG. 13) may be etched and removed even in case that the first lower insulating pattern 121 and the third lower insulating pattern 123 may be integrally formed. Accordingly, a space ES may be formed around the first lower conductive pattern 111.

Even in case that the first conductive layer 110 may be disposed under the semiconductor layer 130, the first lower insulating pattern 121 and the second lower insulating pattern 122 may be disposed substantially flat, and the first semiconductor pattern 131 and the second semiconductor pattern 132 disposed on the first lower insulating pattern 121 and the second lower insulating pattern 122 may also be disposed flat without a step.

Figure 20:
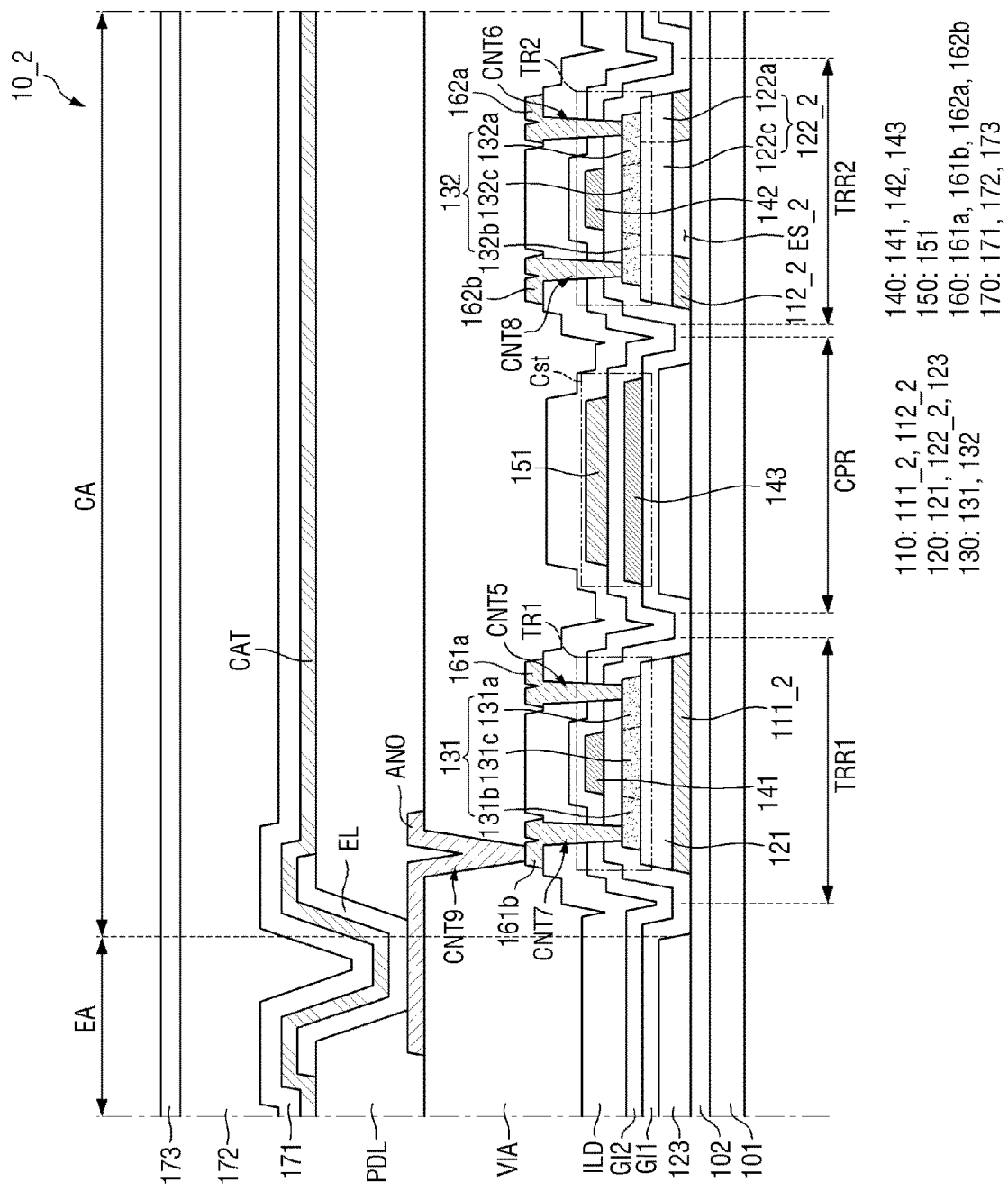
FIG. 20 is a schematic cross-sectional view of a display device according to another embodiment.

FIG. 20 is a schematic cross-sectional view of a display device according to another embodiment.

Referring to FIG. 20, a display device 10_2 according to the embodiment may be different from the display device 10 of the embodiment of FIG. 7 in that the channel region 132c of the second transistor TR2 of the display device 10_2 may overlap a space ES_2 in a thickness direction (third direction DR3).

Specifically, the second lower insulating pattern 122_2 of the display device 10_2 according to the embodiment may include an overlapping region 122a overlapping the second lower conductive pattern 112_2 and a non-overlapping region 122c not overlapping the second lower conductive pattern 112_2. The space ES_2 according to the embodiment may be located between the second lower conductive patterns 112_2. For example, the non-overlapping region 122c may be disposed between the overlapping regions 122a. The overlapping region 122a of the second lower insulating pattern 122_2 may overlap the underlying second lower conductive pattern 112_2 and the overlying semiconductor pattern 132 of the second transistor TR2 in the thickness direction (third direction DR3).

However, the channel region 132c of the second transistor TR2 does not overlap the underlying second lower conductive pattern 112_2 in the thickness direction (third direction DR3), and may overlap the space ES_2 in the thickness direction. The first and second source/drain regions 132a and 132b of the second transistor TR2 may overlap the underlying second lower conductive pattern 112_2 in the thickness direction (third direction DR3). Accordingly, the semiconductor pattern 132 of the second transistor TR2 may be supported by the underlying second lower conductive pattern 112_2, and the channel region 132c of the second transistor TR2 may not descend downward.

However, the space ES_2 may not be disposed under the first lower insulating pattern 121. For example, the first lower conductive pattern 111_2 may be disposed under the first lower insulating pattern 121, but the first lower conductive pattern 111_2 may completely overlap the overlying first lower insulating pattern 121 and the overlying semiconductor pattern 131 of the first transistor TR1.

Even in case that the first conductive layer 110 may be disposed under the semiconductor layer 130, the first lower insulating pattern 121 and the second lower insulating pattern 122 may be disposed substantially flat, and the first semiconductor pattern 131 and the second semiconductor pattern 132 disposed on the first lower insulating pattern 121 and the second lower insulating pattern 122 may also be disposed flat without a step. Moreover, as the space ES_2 may be disposed under the channel region 132c of the second transistor TR2 as a switching transistor, the carrier mobility of the channel region 132c may be increased. As a result, on-off characteristics of the second transistor TR2 may be further improved.

In concluding the detailed description, those skilled in the art will appreciate that many variations and modifications can be made to the embodiments without substantially departing from the principles of the disclosure. Therefore, the disclosed embodiments of the invention are used in a generic and descriptive sense only and not for purposes of limitation.

What is claimed is:

1. A display device, comprising:
    a lower conductive pattern disposed on a substrate;
    a lower insulating layer disposed on the lower conductive pattern, the lower insulating layer including a first lower insulating pattern including:
        an overlapping region overlapping the lower conductive pattern; and
        a protruding region;
    a semiconductor pattern disposed on the first lower insulating pattern and having a side surface, the side surface being aligned with a side surface of the first lower insulating pattern or disposed inward from the side surface of the first lower insulating pattern;
    a gate insulating layer disposed on the semiconductor pattern;
    a gate electrode disposed on the gate insulating layer; and
    an empty space disposed between the substrate and the protruding region of the first lower insulating pattern, wherein an upper portion of the empty space is defined by a lower surface of the protruding region of the first lower insulating pattern,
a side portion of the empty space is defined by the side surface of the lower conductive pattern, and
another side portion of the empty space is defined by the gate insulating layer.

2. The display device of claim 1, wherein
the lower insulating layer further includes a second lower insulating pattern,
a separation region is disposed between the first lower insulating pattern and the second lower insulating pattern, and
the first lower insulating pattern and the second lower insulating pattern are at least partially separated by the separation region.

3. The display device of claim 2, wherein the separation region exposes at least a part of the empty space.

4. The display device of claim 3, wherein the gate insulating layer is disposed in the separation region.

5. The display device of claim 2, wherein the second lower insulating pattern does not overlap the semiconductor pattern.

6. The display device of claim 2, wherein
the first lower insulating pattern and the second lower insulating pattern are completely separated,
the first lower insulating pattern has an island shape, and
the second lower insulating pattern surrounds the first lower insulating pattern.

7. The display device of claim 1, wherein at least a part of the side surface of the semiconductor pattern protrudes outward from the side surface of the lower conductive pattern.

8. The display device of claim 7, wherein
the semiconductor pattern includes a channel region overlapping the gate electrode, and
the channel region overlaps the lower conductive pattern.

9. The display device of claim 8, wherein
the semiconductor pattern includes a first source or drain region and a second source or drain region disposed on a side and another side of the channel region, respectively, and
the first source or drain region and the second source or drain region overlap the empty space.

10. The display device of claim 1, further comprising:
a barrier layer disposed between the substrate and the lower conductive pattern,
wherein a lower portion of the empty space is defined by an upper surface of the barrier layer.

11. The display device of claim 1, wherein a height of the empty space is equal to a thickness of the lower conductive pattern.

12. The display device of claim 1, further comprising:
an upper insulating layer disposed on the gate electrode; and
a signal line disposed on the upper insulating layer and electrically connected to the semiconductor pattern,
wherein the signal line is one of a first power supply line and a data line.

13. The display device of claim 12, further comprising:
a first source or drain electrode and a second source or drain electrode, wherein
the first source or drain electrode, the second source or drain electrode, and the signal line are disposed on a same layer, and
the lower conductive pattern is electrically connected to the gate electrode, or electrically connected to one of the first source or drain electrode and the second source or drain electrode.

14. The display device of claim 1, wherein a lower portion of the empty space is defined by one of an upper surface of the substrate and a barrier layer.

* * * * *